(12) United States Patent
Furukawa et al.

(10) Patent No.: US 6,228,728 B1
(45) Date of Patent: May 8, 2001

(54) METHOD OF FABRICATING SEMICONDUCTOR DEVICE

(75) Inventors: Taisuke Furukawa; Takumi Nakahata; Shigemitsu Maruno; Kohei Sugihara; Yasutaka Nishioka; Satoshi Yamakawa; Yasunori Tokuda, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/243,480

(22) Filed: Feb. 3, 1999

(30) Foreign Application Priority Data

Sep. 11, 1998 (JP) .................................. 10-257949

(51) Int. Cl.[7] ................................................ H01L 21/336
(52) U.S. Cl. ............................................................ 438/300
(58) Field of Search .................................. 438/294, 300, 438/273, 245, 226

(56) References Cited

U.S. PATENT DOCUMENTS 5,970,352 * 10/1999 Shiozawa et al. .................... 438/300
6,017,823 * 1/2000 Shishiguchi et al. ................. 438/300
6,091,117 * 7/2000 Shiozawa et al. .................... 257/384

FOREIGN PATENT DOCUMENTS 2-143456   6/1990 (JP) .

OTHER PUBLICATIONS

"A 0.23μm² Double Self–Aligned Contact Cell for Gigabit DRAMs With a Ge–Added Vertical Expitaxial Si Pad" H. Koga et al., IEDM Tech. Dig., D589 (1996).

"Formation of $SiO_2$ Films by Oxygen–Ion Bombardment" M. Watanabe et al., Japanese Journal of Applied Physics vol. 5, Aug. 1996 pp. 737–738.

"Limitations of selective epitaxial growth conditions in gas–source MBE using $Si_2 H_6$" K. Aketagawa et al., Journal of Crystal Growth 111, 1991, pp. 860–863.

* cited by examiner

Primary Examiner—Michael Trinh
Assistant Examiner—Jeff Vockrodt
(74) Attorney, Agent, or Firm—McDermott, Will & Emery

(57) ABSTRACT

According to the inventive method of fabricating a semiconductor device, a silicon substrate is exposed to an oxygen atmosphere of 600° C. to 900° C., for forming silicon oxide films on surfaces of epitaxial silicon layers and those of silicon fragments. Thus, a method of fabricating a semiconductor device capable of preventing electrodes thereof from shorting can be provided.

20 Claims, 31 Drawing Sheets

METHOD OF FABRICATING SEMICONDUCTOR DEVICE

BACKGROUND OF THE INVENTION

1. Field of the Invention

The present invention relates to a method of fabricating a semiconductor device, and more specifically, it relates to a method of fabricating a semiconductor device for improving the reliability of a high-speed device employing a lifting structure of source/drain regions.

2. Description of the Prior Art

First and second conventional methods of fabricating field-effect transistors employing selective epitaxy for a lifting structure of source/drain regions are now described with reference to the drawings.

The first conventional method of fabricating a field-effect transistor is described with reference to FIGS. 45 to 51.

Referring to FIG. 45, element isolation films 2 are formed on a major surface of a silicon substrate 1 by trench isolation. The element isolation films 2 define an active region for forming a MOS (metal oxide semiconductor) transistor or the like on the surface of the silicon substrate 1. Thereafter a gate insulator film 3 is formed on the active region of the silicon substrate 1 by thermal oxidation.

A polysilicon film 4 and a silicon oxide film 5 are deposited on the major surface of the silicon substrate 1. Thereafter a photoresist film having a prescribed pattern is formed on the silicon oxide film 5 for thereafter anisotropically etching the polysilicon film 4 and the silicon oxide film 5 through the photoresist film serving as a mask and patterning the gate insulator film 3, the polysilicon film 4 and the silicon oxide film 5, for completing a gate electrode 6 consisting of the polysilicon film 4 and the silicon oxide film 5.

Referring to FIG. 46, an impurity is ion-implanted into the silicon substrate 1 through the gate electrode 6 serving as a mask, for forming n impurity regions 7a and 8a. Thereafter side walls 9 consisting of insulator films are formed on side surfaces of the gate electrode 6. Thereafter an impurity is ion-implanted into the silicon substrate 1 through the gate electrode 6 and the side walls 9 serving as masks, for forming $n^+$ impurity regions 7b and 8b. Thus, a source region 7 and a drain region 8 are completed.

Referring to FIG. 47, epitaxial silicon layers 10 are formed on the source region 7 and the drain region 8 through selective epitaxy. Thereafter an impurity is introduced into the epitaxial silicon layers 10 by ion implantation.

Referring to FIG. 48, a metal thin film 22 of titanium is formed on the silicon substrate 1 by sputtering or the like. Referring to FIG. 49, the silicon substrate 1 is thereafter heat-treated at a high temperature for reacting the epitaxial silicon layers 10 with the metal thin film 22 and forming titanium silicide layers 23.

Referring to FIG. 50, the unreacted part of the metal thin film 22 is removed with sulfuric acid and hydrogen peroxide. No titanium silicide films 23 are formed on the side walls 9 provided with no epitaxial silicon layers 10. The gate electrode 6 is electrically isolated from the source region 7 and the drain region 8.

Referring to FIG. 51, an interlayer isolation film 14 is formed on the silicon substrate 1 by chemical vapor deposition or the like. Thereafter contact holes 14a are formed in the interlayer isolation film 14. Thereafter tungsten plugs 15 and aluminum wiring layers 16 are formed by a well-known technique, for completing a source electrode 18 and a drain electrode 19. A first field-effect transistor having the gate electrode 6, the source electrode 18 and the drain electrode 19 is completed through the aforementioned steps.

The second conventional method of fabricating a field-effect transistor is now described with reference to FIGS. 52 to 58.

Referring to FIG. 52, element isolation films 2 are formed on a major surface of a silicon substrate 1 by trench isolation. The element isolation films 2 define an active region for forming a MOS transistor or the like on the surface of the silicon substrate 1. Thereafter a gate insulator film 3 is formed on the active region of the silicon substrate 1 by thermal oxidation.

A polysilicon film is deposited on the major surface of the silicon substrate 1. Thereafter a photoresist film having a prescribed pattern is formed on the polysilicon film for thereafter anisotropically etching the gate insulator film 3 and the polysilicon film through the photoresist film serving as a mask and patterning the polysilicon film, for completing a gate electrode 6 consisting of the polysilicon film.

Referring to FIG. 53, an impurity is thereafter ion-implanted into the silicon substrate 1 through the gate electrode 6 serving as a mask, for forming $n^-$ impurity regions 7a and 8a. Thereafter side walls 9 consisting of insulator films are formed on side surfaces of the gate electrode 6. Thereafter an impurity is ion-implanted into the silicon substrate 1 through the gate electrode 6 and the side walls 9 serving as masks, for forming $n^+$ impurity regions 7b and 8b. Thus, a source region 7 and a drain region 8 are completed.

Referring to FIG. 54, epitaxial silicon layers 10 are formed on the source region 7 and the drain region 8 through selective epitaxy. At this time, an epitaxial silicon layer 10 is formed also on the gate electrode 6. Thereafter an impurity is introduced into the epitaxial silicon layers 10 by ion implantation.

Referring to FIG. 55, a metal thin film 22 of titanium is formed on the silicon substrate 1 by sputtering or the like. Referring to FIG. 56, the silicon substrate 1 is thereafter heat-treated at a high temperature for reacting the epitaxial silicon layers 10 with the metal thin film 22 and forming titanium silicide layers 23. A titanium silicide layer 23 is formed also on the epitaxial silicon layer 10 formed on the gate electrode 6.

Referring to FIG. 57, the unreacted part of the metal thin film 22 is removed with sulfuric acid and hydrogen peroxide. No titanium silicide layers 23 are formed on the side walls 8 provided with no epitaxial silicon layers 10. The gate electrode 6 is electrically isolated from the source region 7 and the drain region 8.

Referring to FIG. 58, an interlayer isolation film 14 is formed on the silicon substrate 1 by chemical vapor deposition or the like. Thereafter contact holes 14a are formed in the interlayer isolation film 14. Thereafter tungsten plugs 15 and aluminum wiring layers 16 are formed by a well-known technique, for completing a source electrode 18 and a drain electrode 19. A second field-effect transistor having the gate electrode 6, the source electrode 18 and the drain electrode 19 is completed through the aforementioned steps.

The aforementioned two conventional methods of fabricating field-effect transistors through selective epitaxy have the following problems:

In the first conventional method of fabricating a field-effect transistor, the epitaxial silicon layers 10 are formed only on the source region 7 and the drain region 8, as shown in FIG. 47. Literature "Journal of Crystal Growth 111" (1991), pp. 860 to 863 reports that silicon fragments of such epitaxial silicon layers 10 are formed on the side walls 9 when the thickness of the epitaxial silicon layers 10 exceeds a certain value in formation thereof.

This literature describes that material gas of disilane, for example, colliding with a surface of the silicon oxide film 5 during the growth process of the epitaxial silicon layers 10 is partially decomposed to form movable adatoms on the surface of the silicon oxide film 5.

When the surface of the silicon oxide film 5 is covered with the adatoms in a certain ratio, polysilicon grows from the adatoms serving as nuclei. The growing polysilicon forms the silicon fragments. When the side walls 9 are formed by silicon nitride films, further, the limit thickness for preventing such formation of the silicon fragments is reduced.

When forming the epitaxial silicon layers 10 in a thickness of 20 nm under a silicon substrate temperature of 680° C. and a disilane flow rate of 0.2 sccm, for example, the deposition time is about four minutes. At this time, silicon fragments of polysilicon having a thickness of about 4 nm are formed on the side walls 9 of silicon nitride films.

When the silicon fragments are formed on upper surfaces of the side walls 9, the source electrode 18 and the drain electrode 19 may be shorted through the silicon fragments.

Particularly when the metal thin film 22 is formed by sputtering after formation of the epitaxial silicon layers 10 to be reacted with the epitaxial silicon layers 10 by high-temperature heat treatment for forming the titanium silicide layers 23 as described with reference to FIG. 48, the silicon fragments react with the metal thin film 22 to form unnecessary titanium silicide layers 23a, as shown in FIG. 59.

After the unreacted part of the metal thin film 22 is removed with sulfuric acid and hydrogen peroxide or the like, the unnecessary silicide layers 23a remain on the side walls 9. Thus, the source electrode 18 and the drain electrode 19 are disadvantageously shorted due to the presence of a smaller amount of unnecessary titanium silicide layers 23a remaining on the side walls 9.

Also in the second conventional method of fabricating a field-effect transistor, the gate electrode 6 is disadvantageously shorted with the source electrode 18 and the drain electrode 19 due to unnecessary titanium silicide layers 23a formed on the side walls 9 when the titanium silicide layer 23 is also formed on the epitaxial silicon layer 22 growing on the gate electrode 6, as shown in FIG. 60.

SUMMARY OF THE INVENTION

In order to solve the aforementioned problems, an object of the present invention is to provide a method of fabricating a semiconductor device which can prevent electrodes thereof from shorting.

The method of fabricating a semiconductor device according to the present invention includes the following steps:

First, an element forming region electrically isolated by an element isolation film is formed on a major surface of a semiconductor substrate. Thereafter a gate electrode is formed on the element forming region.

Then, a source region is formed on one of two areas of the element forming region divided by the gate electrode while a drain region is formed on the remaining area. Thereafter side walls of insulator films are formed on side surfaces of the gate electrode.

Then, semiconductor thin films are formed on surfaces of the source region and the drain region. Thereafter semiconductor crystals formed on surfaces of the side walls during the growth process of the semiconductor thin films are oxidized or removed for electrically isolating the source region, the drain region and the gate electrode from each other.

According to the inventive method of fabricating a semiconductor device, a MOS transistor including a pair of source/drain regions and a gate electrode is formed on the element forming region of the major surface of the semiconductor substrate. While semiconductor crystals adhere to upper surfaces of the side walls between the source/drain regions and the gate electrode of the MOS transistor during the growth step of the semiconductor thin films, such semiconductor crystals are oxidized or removed through the isolation step for preventing a source electrode, a drain electrode and the gate electrode of the MOS transistor from shorting. Consequently, a semiconductor device having excellent electrical reliability can be obtained Preferably, the semiconductor thin film growth step is carried out through solid-phase epitaxy or vapor-phase selective growth or vapor-phase selective epitaxy.

According to this method, the semiconductor thin films formed on the source/drain regions and the semiconductor crystals growing on the upper surfaces of the side walls are different in film quality from each other. For example, the semiconductor crystals growing on the upper surfaces of the side walls are smaller in thickness than the semiconductor thin films formed on the source/drain regions.

Therefore, the semiconductor crystals growing on the side walls are oxidized at a higher speed or removed at a higher etching rate than the semiconductor thin films formed on the source/drain regions.

Consequently, the source electrode, the drain electrode and the gate electrode of the MOS transistor are isolated from each other through the isolation step, and a semiconductor device having excellent electrical reliability can be obtained.

Preferably, the isolation step includes an oxidation step of exposing surfaces of the semiconductor thin films to an atmosphere containing oxygen.

If made of silicon, the semiconductor crystals react with the oxygen contained in the atmosphere to which the semiconductor substrate is exposed, to form silicon oxide films. Also when the gate electrode is formed by a polysilicon film, a silicon oxide film is formed on a surface of the gate electrode.

Consequently, the source/drain regions are electrically isolated from the gate electrode, and a semiconductor device having superior electrical reliability can be obtained.

Preferably, the isolation step includes a first oxidation step of introducing ions containing oxygen into the surfaces of the semiconductor thin films for oxidizing the surfaces of the semiconductor thin films.

Thus, oxygen is introduced into the semiconductor crystals by introducing the ions containing oxygen into the semiconductor substrate, to form silicon oxide films if the semiconductor crystals are made of silicon. Also when the gate electrode is formed by a polysilicon thin film, a silicon oxide film is formed on the surface of the gate electrode.

Consequently, the source/drain regions are electrically isolated from the gate electrode, and a semiconductor device having superior electrical reliability can be obtained.

More preferably, the isolation step further includes a second oxidation step of heat-treating the semiconductor substrate including the semiconductor thin films for further oxidizing the surfaces of the semiconductor thin films after the first oxidation step.

In this case, the heat treatment facilitates oxidation of silicon unreacted during the oxidation through introduction of the ions. Thus, the semiconductor crystals consisting of polysilicon thin films can be oxidized with a smaller quantity of oxygen.

Consequently, a semiconductor device having superior electrical reliability can be obtained while keeping less damage of the element caused by introduction of the ions.

More preferably, the method further includes a removal step of dipping the semiconductor thin films in a solution containing hydrofluoric acid or exposing the same to gas containing hydrofluoric acid after the isolation step.

In this case, silicon oxide films formed on the surfaces of the semiconductor thin films consisting of polysilicon and the surface of the gate electrode and those formed around the semiconductor crystals made of silicon are removed through the hydrofluoric acid treatment step. At this time, the semiconductor crystals are also removed simultaneously with the silicon oxide films.

Consequently, the source/drain regions are electrically isolated from the gate electrode, and the electrical reliability of the MOS transistor can be further improved.

Preferably, the isolation step further includes a step of dipping the semiconductor substrate including the growing semiconductor thin films in a solution containing acid or exposing the same to gas containing acid.

In this case, the surfaces of the semiconductor thin films made of polysilicon, that of the gate electrode and those of the semiconductor crystals are etched with the acid. The etching rate for the semiconductor crystals is higher than that for the semiconductor thin films, or the semiconductor crystals are smaller in thickness than the semiconductor thin films. Thus, the semiconductor crystals formed on the side walls can be removed by controlling the etching conditions for not appreciably etching the semiconductor thin films.

Consequently, the source/drain regions are electrically isolated from the gate electrode, and a semiconductor device having superior electrical reliability can be obtained.

A mixed solution containing hydrofluoric acid and nitric acid can be employed as the aforementioned solution.

More preferably, a chemical solution having an etching rate varied with the plane orientation of the surface of the semiconductor substrate is employed for the removal step of dipping the semiconductor thin films in the solution containing acid or exposing the same to the gas containing acid.

In this case, the semiconductor crystals formed on the side walls can be removed while not appreciably removing the semiconductor thin films due to the difference between the etching rates therefor.

Particularly when the semiconductor thin films are formed through epitaxy, only a certain crystal plane is exposed to the chemical solution since the surfaces of the semiconductor thin films have certain determined plane orientation and the etching rate can be suppressed by selecting a proper chemical solution.

The etching rate for the semiconductor crystals formed on the side walls, having no such orientation of crystal planes, remains high.

Thus, the semiconductor crystals formed on the side walls can be removed while suppressing the amount of removal of the semiconductor thin films. Consequently, the source/drain regions are electrically isolated from the gate electrode, and a semiconductor device having superior electrical reliability can be obtained.

The semiconductor substrate is formed by that having a surface plane oriented along the (111) plane, so that the semiconductor thin films are dipped in a solution of potassium hydroxide.

Preferably, the isolation step includes a removal step of exposing the semiconductor thin films to a plasma in a mixed gas atmosphere of gas containing at least one element selected from a group consisting of fluorine, chlorine, bromine, iodine and astatine and oxygen gas.

In this case, the surfaces of the semiconductor thin films made of polysilicon, that of the gate electrode and those of the semiconductor crystals are etched with the plasma. The etching rate for the semiconductor crystals is higher than that for the semiconductor thin films, or the semiconductor crystals are smaller in thickness than the semiconductor thin films. Thus, the semiconductor crystals formed on the side walls can be removed by controlling the etching conditions for not appreciably etching the semiconductor thin films.

Consequently, the source/drain regions are electrically isolated from the gate electrode, and a semiconductor device having superior electrical reliability can be obtained.

Preferably, the isolation step includes a removal step having a step of forming a metal film on the surfaces of the semiconductor thin films and a step of heat-treating the semiconductor substrate including the metal film.

In this case, the metal film is formed on the semiconductor substrate including the MOS transistor. Thereafter the grown semiconductor thin films react with the metal film to form metal silicide films due to the heat treatment at a prescribed temperature. At this time, the semiconductor crystals provided in an extremely small amount are diffused in the metal film. Thereafter the metal film is removed.

Consequently, the source/drain regions can be electrically isolated from the gate electrode while reducing electrical resistance on the surfaces of the source/drain regions, and the reliability of the high-speed MOS transistor can be further improved.

The step of removing the metal film includes a step of dipping the semiconductor substrate in a mixed solution of sulfuric acid and hydrogen peroxide.

The metal film can be prepared from any of titanium, cobalt, zirconium and hafnium.

Preferably, the isolation step includes a removal step of polishing the surfaces of the semiconductor thin films.

In this case, the semiconductor crystals, having smaller areas adhering to the semiconductor substrate than the semiconductor thin films, can be readily removed by polishing the semiconductor thin films. Thus, the semiconductor crystals formed on the side walls can be removed by controlling the polishing conditions for not appreciably influencing the semiconductor thin films.

Consequently, the source/drain regions are electrically isolated from the gate electrode, and a semiconductor device having superior electrical reliability can be obtained.

Preferably, the isolation step includes a removal step of irradiating the surfaces of the semiconductor thin films with a fine liquid or particulates at a high speed.

In this case, the semiconductor crystals, having smaller areas adhering to the semiconductor substrate than the semiconductor thin films, can be readily removed by bombardment. Therefore, the semiconductor crystals formed on the side walls can be removed by controlling the bombardment conditions for not appreciably influencing the semiconductor thin films.

Consequently, the source/drain regions are electrically isolated from the gate electrode, and a semiconductor device having superior electrical reliability can be obtained.

Preferably, the isolation step includes a removal step of irradiating the surfaces of the semiconductor thin films with ultrasonic waves while dipping or sprinkling the semiconductor thin films in or with a liquid.

In this case, the semiconductor crystals, having smaller areas adhering to the semiconductor substrate than the semiconductor thin films, can be readily removed due to irradiation with the ultrasonic waves. Therefore, the semiconductor crystals formed on the side walls can be removed by controlling the conditions for irradiating the semiconductor thin films with the ultrasonic waves for not appreciably influencing the semiconductor thin films.

Consequently, the source/drain regions are electrically isolated from the gate electrode, and a semiconductor device having superior electrical reliability can be obtained.

Preferably, the isolation step includes a removal step of exposing the surfaces of the semiconductor thin films to halogen gas containing any of fluorine, chlorine, bromine, iodine and astatine.

In this case, the surfaces of the grown semiconductor thin films, that of polysilicon forming the gate electrode and those of the semiconductor crystals are etched with the halogen gas due to the exposure of the surface of the semiconductor substrate including the grown semiconductor thin films to the halogen gas.

The etching rate for the semiconductor crystals is higher than that for the semiconductor thin films, or the semiconductor crystals are smaller in thickness than the semiconductor thin films. Thus, the semiconductor crystals formed on the side walls can be removed by controlling the etching conditions for not appreciably etching the semiconductor thin films.

Consequently, the source/drain regions are electrically isolated from the gate electrode, and a semiconductor device having superior electrical reliability can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
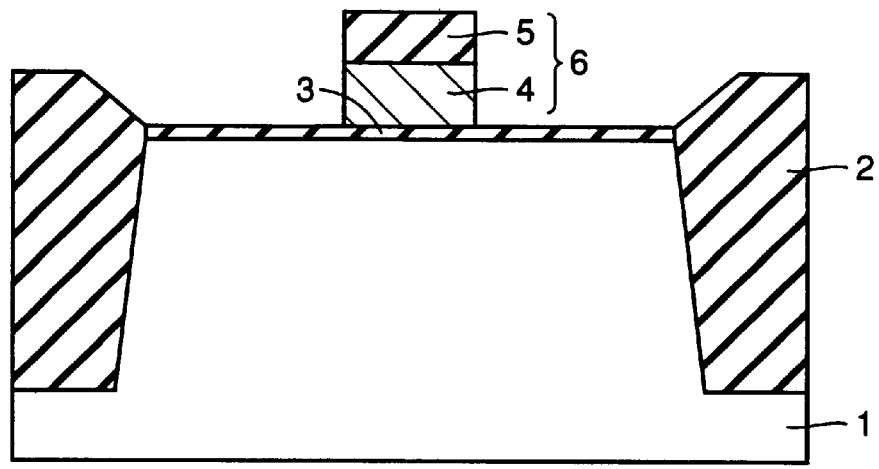
FIG. 1 is a sectional view showing a step of forming a gate electrode 6 in a method of fabricating a field-effect transistor according to an embodiment 1 of the present invention.

Methods of fabricating field-effect transistors according to embodiments 1 to 28 of the present invention are now described. The method of fabricating a field-effect transistor according to each of the embodiments 1 to 14 corresponds to the structure of the first field-effect transistor described with reference to the prior art, and that according to each of the embodiments 15 to 28 corresponds to the structure of the second field-effect transistor described with reference to the prior art. In the following description of the embodiments, portions identical or corresponding to each other are denoted by the same reference numerals.

[Embodiment 1]

The method of fabricating a field-effect transistor according to the embodiment 1 is now described with reference to FIGS. 1 to 8.

Referring to FIG. 1, element isolation films 2 consisting of silicon oxide films or the like are formed on a major surface of a silicon substrate 1 by trench isolation. The element isolation films 2 define an active region for forming a MOS transistor or the like on the surface of the silicon substrate 1. Thereafter a gate insulator film 3 consisting of a silicon oxide film or the like is formed on the active region of the silicon substrate 1 by thermal oxidation.

A polysilicon film 4 and a silicon oxide film 5 are deposited on the major surface of the silicon substrate 1. Thereafter a photoresist film having a prescribed pattern is formed on the silicon oxide film 5 and thereafter employed as a mask for anisotropically etching the polysilicon film 4 and patterning these film 4, for completing a gate electrode 6 consisting of the polysilicon film 4 and the silicon oxide film 5.

Figure 2:
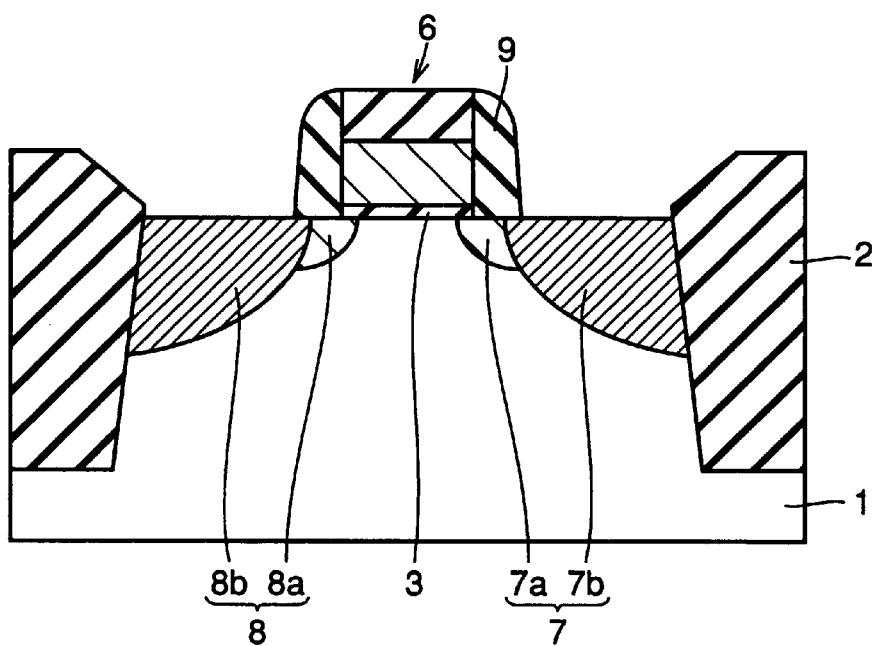
FIG. 2 is a sectional view showing a step of forming source/drain regions 7 and 8 in the method of fabricating a field-effect transistor according to the embodiment 1 of the present invention.

Referring to FIG. 2, an impurity is ion-implanted into the silicon substrate 1 through the gate electrode 6 serving as a mask, for forming n impurity regions 7a and 8a. Thereafter side walls 9 consisting of silicon nitride films are formed on side surfaces of the gate electrode 6. Thereafter an impurity is ion-implanted into the silicon substrate 1 through the gate electrode 6 and the side walls 9 serving as masks, for forming $n^+$ impurity regions 7b and 8b. Thus, a source region 7 and a drain region 8 are completed.

Figure 3:
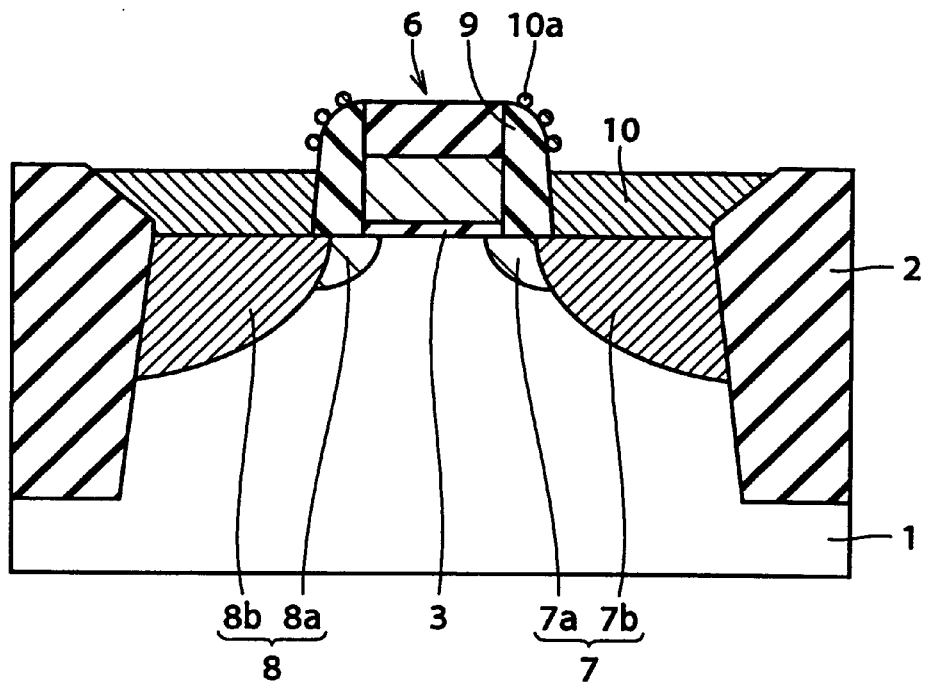
FIG. 3 is a sectional view showing a step of forming epitaxial silicon layers 10 in the method of fabricating a field-effect transistor according to the embodiment 1 of the present invention.

Referring to FIG. 3, epitaial silicon layers 10 are formed on the source region 7 and the drain region 8 through chemical vapor deposition such as solid-phase epitaxy or vapor-phase selective epitaxy, for example.

If the thickness of the epitaxial silicon layers 10 exceeds a critical value due to process fluctuation or the like, silicon fragments 10a are formed on the side walls 9. In this embodiment, the side walls 9 are formed by silicon nitride films and hence the silicon fragments 10a are readily formed on the side walls 9 in particular.

Figure 4:
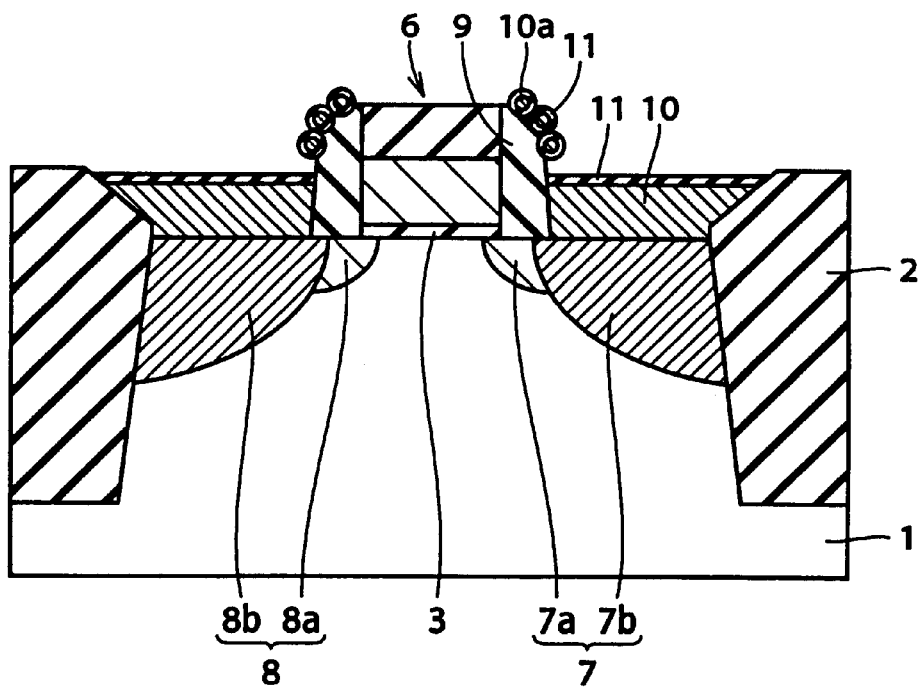
FIG. 4 is a sectional view showing a step of forming silicon oxide films 11 in the method of fabricating a field-effect transistor according to the embodiment 1 of the present invention.

Referring to FIG. 4, the silicon substrate 1 is exposed to an oxygen atmosphere of 600 to 900° C., for forming silicon oxide films 11 on surfaces of the epitaxial silicon layers 10 and those of the silicon fragments 10a. At this time, the silicon oxide films 11 having the same withstand voltage characteristics can be formed at a lower oxidation temperature by simultaneously mixing hydrogen or moisture. Thereafter an impurity is introduced into the epitaxial silicon layers 10 by ion implantation.

Figure 5:
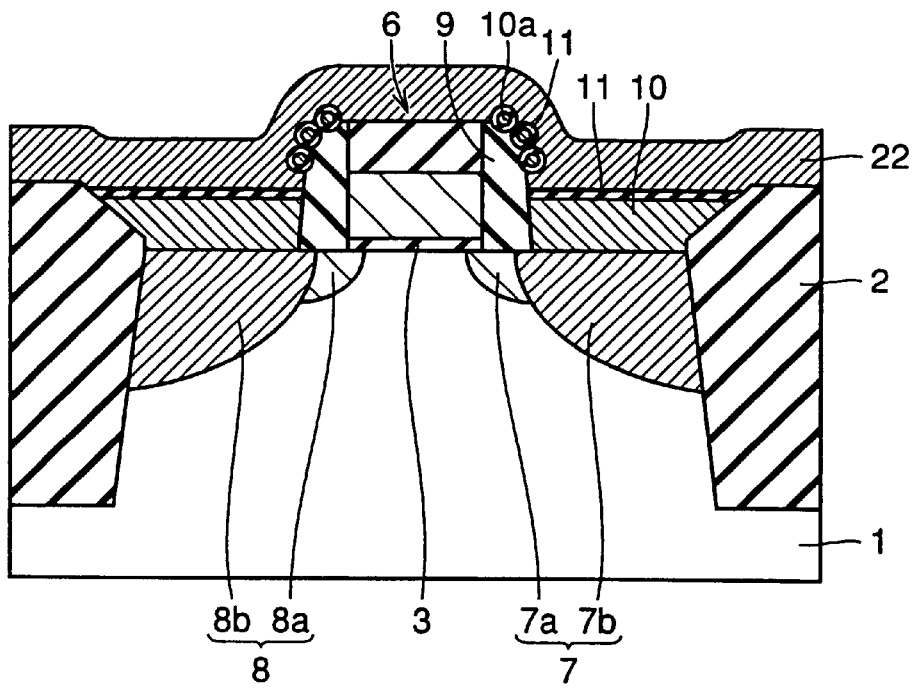
FIG. 5 is a sectional view showing a step of forming a metal thin film 22 in the method of fabricating a field-effect transistor according to the embodiment 1 of the present invention.
Figure 6:
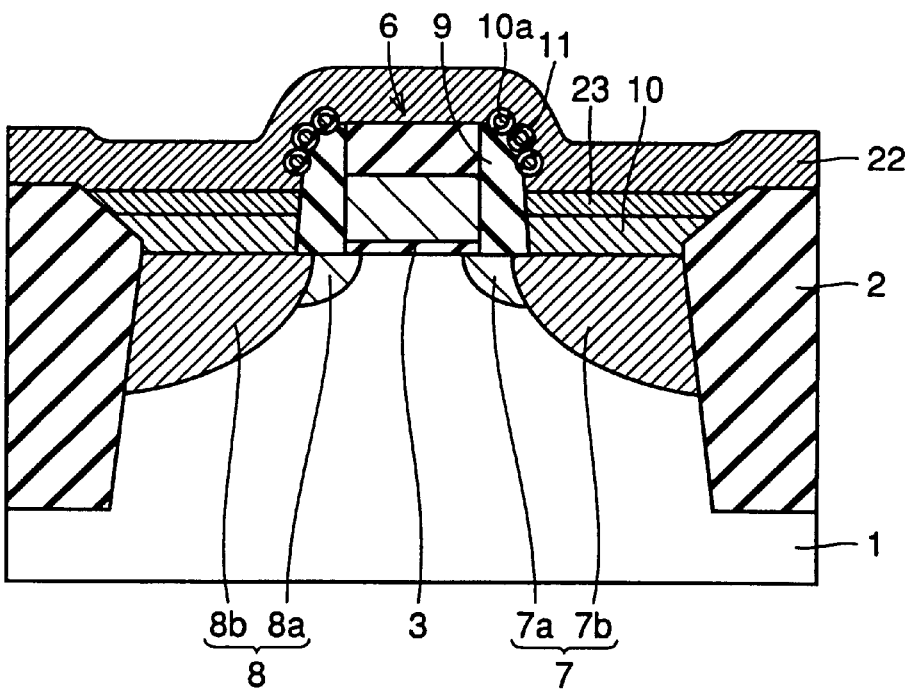
FIG. 6 is a sectional view showing a step of forming titanium silicide layers 23 in the method of fabricating a field-effect transistor according to the embodiment 1 of the present invention.

Referring to FIG. 5, a metal thin film 22 of titanium is formed on the silicon substrate 1 by sputtering or the like. Referring to FIG. 6, the silicon substrate 1 is thereafter heat-treated at a high temperature for reacting the epitaxial silicon layers 10 with the metal thin film 22 and forming titanium silicide layers 23. At this time, the titanium silicide layers 23 absorb the silicon oxide films 11 formed on the epitaxial silicon layers 10.

Figure 7:
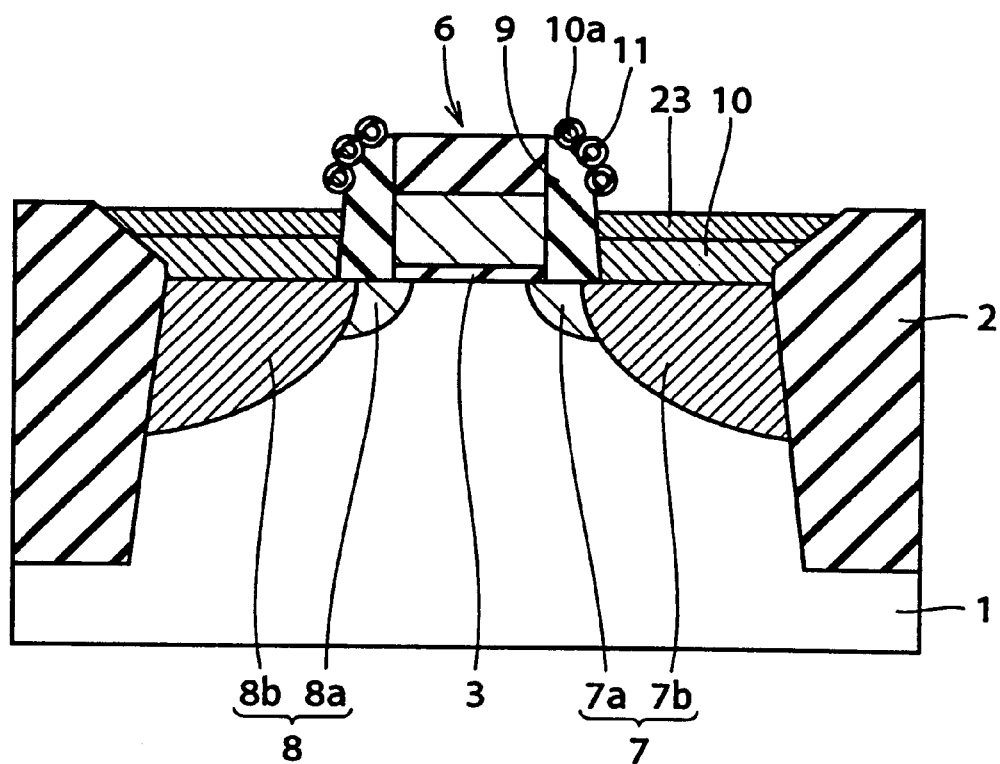
FIG. 7 is a sectional view showing a step of removing an unreacted part of the metal thin film 22 in the method of fabricating a field-effect transistor according to the embodiment 1 of the present invention.

Referring to FIG. 7, the unreacted part of the metal thin film 22 is removed with the mixture of sulfuric acid and hydrogen peroxide, and the like.

Figure 8:
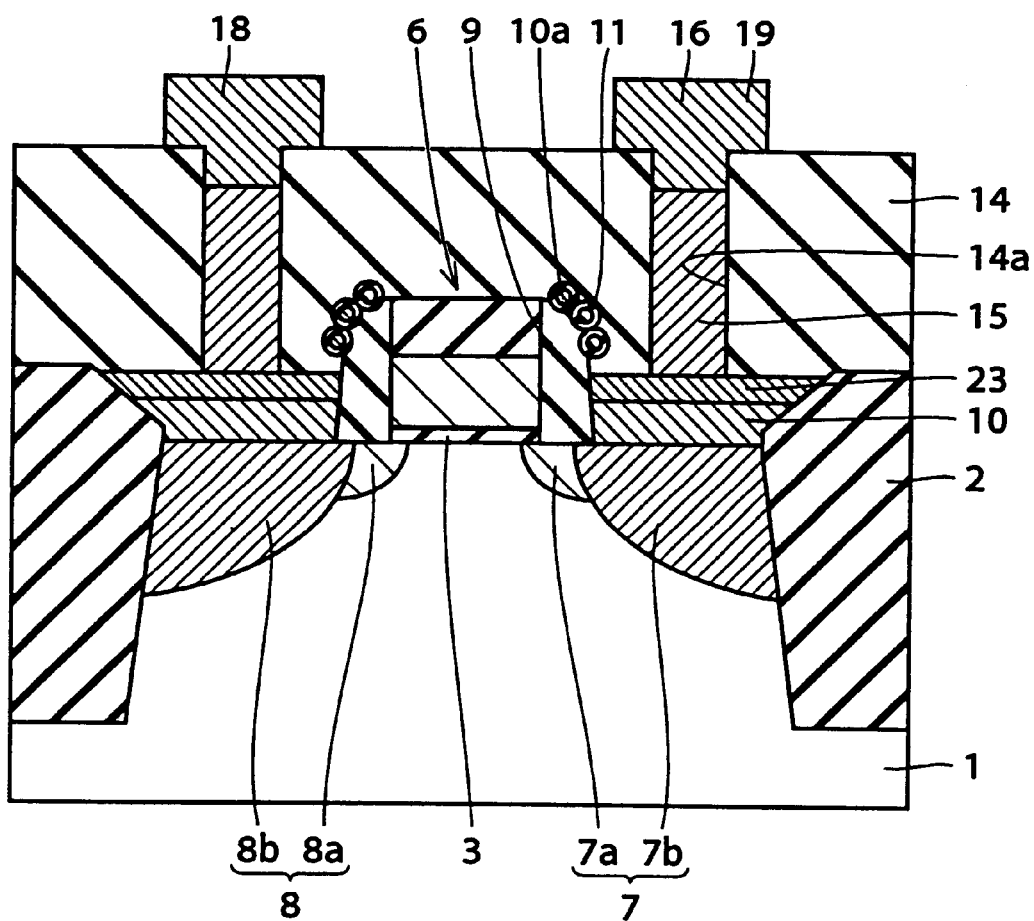
FIG. 8 is a sectional view showing a step of forming a source electrode 18 and a drain electrode 19 in the method of fabricating a field-effect transistor according to the embodiment 1 of the present invention.

Referring to FIG. 8, an interlayer isolation film 14 is formed on the silicon substrate 1 by chemical vapor deposition or the like. Thereafter contact holes 14a are formed in the interlayer isolation film 14. Thereafter tungsten plugs 15 and aluminum wiring layers 16 are formed by a well-known technique for completing a source electrode 18 and a drain electrode 19. According to this embodiment, a field-effect transistor having the gate electrode 6, the source electrode 18 and the drain electrode 19 is completed through the aforementioned steps.

In the aforementioned method of fabricating a field-effect transistor according to the embodiment 1, the silicon substrate 1 is exposed to the atmosphere containing oxygen, for forming the silicon oxide films 11 on the surfaces of the silicon fragments 10a. Consequently, an electrical conducting state caused by the silicon fragments 10a can be avoided, isolation between the source electrode 18 and the drain electrode 19 is improved, and a field-effect transistor having high electrical reliability can be formed.

[Embodiment 2]

The method of fabricating a field-effect transistor according to the embodiment 2 is now described with reference to FIGS. 9 and 10. Steps up to that for forming epitaxial silicon layers 10 on a source region 7 and a drain region 8 are identical to those of the embodiment 1 described with reference to FIGS. 1 to 3, and hence redundant description is omitted.

Figure 9:
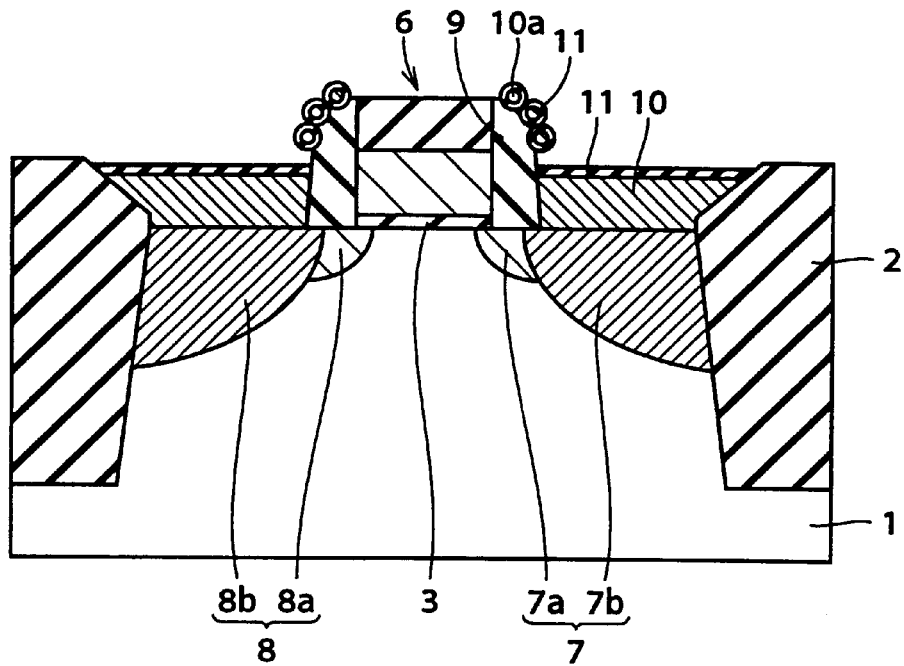
FIG. 9 is a sectional view showing a step of forming silicon oxide films 11 in a method of fabricating a field-effect transistor according to an embodiment 2 of the present invention.

Referring to FIG. 9, a silicon substrate 1 is exposed to an oxygen atmosphere of 600 to 900° C. for forming silicon oxide films 11 on surfaces of the epitaxial silicon layers 10 and those of silicon fragments 10a, similarly to the embodiment 1 (see FIG. 4). At this time, the silicon oxide films 11 having the same withstand voltage characteristics can be formed at a lower oxidation temperature by simultaneously mixing hydrogen or moisture.

Figure 10:
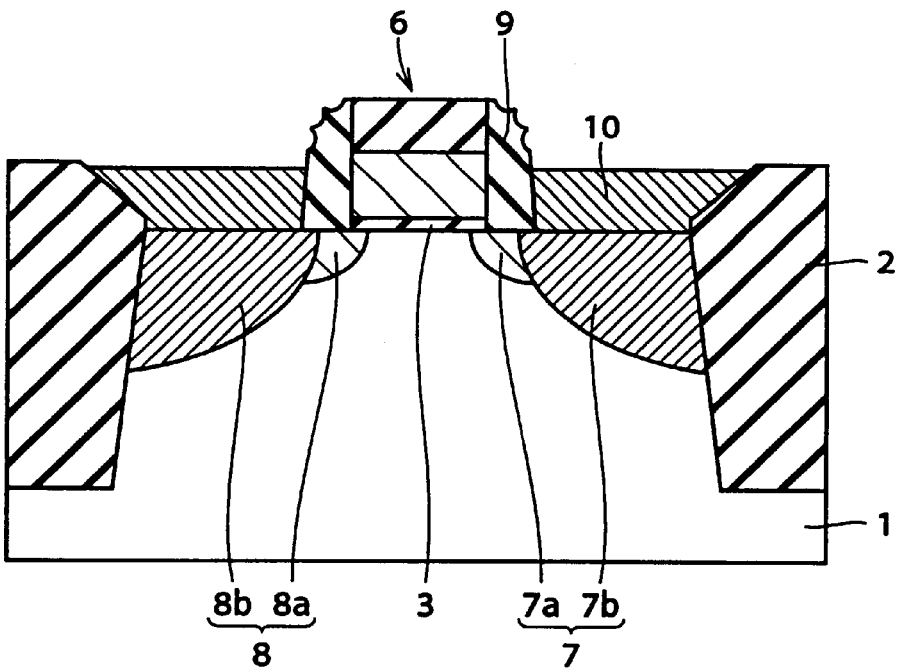
FIG. 10 is a sectional view showing a step of removing silicon fragments 10a in the method of fabricating a field-effect transistor according to the embodiment 2 of the present invention.

Referring to FIG. 10, the silicon substrate 1 is dipped in a solution of hydrofluoric acid. The concentration of the hydrofluoric acid solution is preferably 0.1% to 5.0%, and the time for dipping the silicon substrate 1 therein is preferably 10 seconds to 300 seconds. Thus, the silicon oxide films 11 are dissolved in the hydrofluoric acid solution. At this time, the silicon fragments 10a covered with the silicon oxide films 11 shown in FIG. 9 precipitate in the hydrofluoric acid solution to disappear. Thereafter an impurity is introduced into the epitaxial silicon layers 10 by ion implantation. Thereafter a field-effect transistor is completed through steps similar to those in the embodiment 1 shown in FIGS. 5 to 8.

In the aforementioned method of fabricating a field-effect transistor according to the embodiment 2, the silicon substrate 1 is exposed to the atmosphere containing oxygen for forming the silicon oxide films 11 on the surfaces of the silicon fragments 10a. Further, the silicon oxide films 11 are removed by etching with hydrofluoric acid, for improving isolation between the source electrode 18 and the drain electrode 19. Thus, a field-effect transistor having high electrical reliability can be formed.

[Embodiment 3]

The method of fabricating a field-effect transistor according to the embodiment 3 is described with reference to FIG. 11. Steps up to that for forming epitaxial silicon layers 10 on a source region 7 and a drain region 8 are identical to those of the embodiment 1 described with reference to FIGS. 1 to 3, and hence redundant description is omitted.

Figure 11:
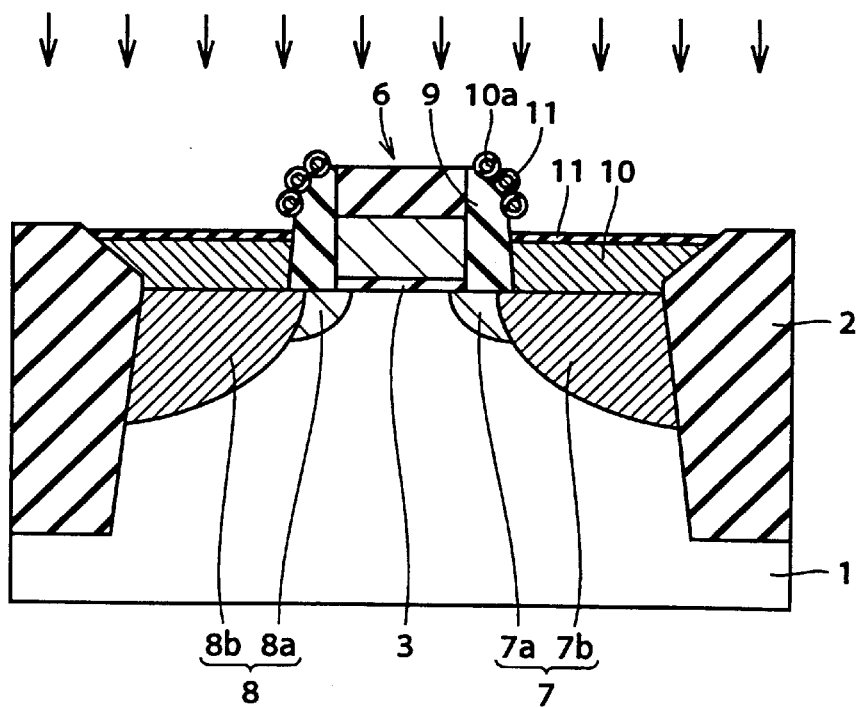
FIG. 11 is a sectional view showing an oxygen ion introduction step in a method of fabricating a field-effect transistor according to each of embodiments 3, 4 and 5 of the present invention.

Referring to FIG. 11, the epitaxial silicon layers 10 are formed through a step similar to that in the embodiment 1. At this time, silicon fragments 10a are formed on side walls 9.

Then, oxygen ions are injected into the overall surface of a silicon substrate 1. The oxygen ions are injected under injection energy of 2 keV to 20 keV at an injection rate of $1 \times 10^{15}$ cm$^{-2}$ to $1 \times 10^{21}$ cm$^{-2}$. Thus, insulating silicon oxide films 11 are formed on surfaces of the silicon fragments 10a and the epitaxial silicon films 10. As to a technique of forming silicon oxide films by injecting oxygen ions, "Formation of SiO$_2$ Films by Oxygen-Ion Bombardment", Japanese Journal of Applied Physics 5, pp. 737 to 738 (1966) can be referred to. Thereafter a field-effect transistor is completed through steps similar to those in the embodiment 1 shown in FIGS. 5 to 8.

In the aforementioned method of fabricating a field-effect transistor according to the embodiment 3, the silicon fragments 10a can be oxidized. Consequently, isolation between a source electrode 18 and a drain electrode 19 is improved and a field-effect transistor having high electrical reliability can be formed. Further, the possibility of oxidizing the silicon fragments 10a with no heat treatment is advantageous for formation of a shallow junction.

[Embodiment 4]

The method of fabricating a field-effect transistor according to the embodiment 4 is described with reference to FIG. 11, similarly to the embodiment 3. Steps up to that for forming epitaxial silicon layers 10 on a source region 7 and a drain region 8 are identical to those of the embodiment 1 described with reference to FIGS. 1 to 3, and hence redundant description is omitted.

Referring to FIG. 11, the epitaxial silicon layers 10 are formed through a step similar to that in the embodiment 1. At this time, silicon fragments 10a are formed on side walls 9.

Then, oxygen ions are injected into the overall surface of a silicon substrate 1. The oxygen ions are injected under injection energy of 2 keV to 20 keV at an injection rate of $1 \times 10^{14}$ cm$^{-2}$ to $1 \times 10^{20}$ cm$^{-2}$, dissimilarly to the embodiment 3. Thus, insulating silicon oxide films 11 are formed on surfaces of the silicon fragments 10a and the epitaxial silicon films 10. Further, the silicon substrate 1 is heat-treated for facilitating formation of the silicon oxide films 11 with the oxygen ions. In case of employing Rapid Thermal Annealing, the heat treatment is typically carried out in a nitrogen atmosphere at about 900° C. for 30 seconds. Thereafter a field-effect transistor is completed through steps similar to those in the embodiment 1 shown in FIGS. 5 to 8.

In the aforementioned method of fabricating a field-effect transistor according to the embodiment 4, the injection rate of the oxygen ions for oxidizing the silicon fragments 10a may not be appreciably increased as compared with the method of fabricating a field-effect transistor according to the embodiment 3. As compared with a case of only thermally oxidizing the silicon fragments 10a, the time for heat-treating the silicon substrate 1 can be reduced.

Consequently, isolation between a source electrode 18 and a drain electrode 19 is improved and a field-effect transistor having high electrical reliability can be formed. Further, the possibility of oxidizing the silicon fragments 10a with less heat treatment compared with a case of only thermally oxidizing the silicon fragments 10a is advantageous for formation of a shallow junction.

[Embodiment 5]

The method of fabricating a field-effect transistor according to the embodiment 5 is described with reference to FIGS. 11 and 12. Steps up to that for forming epitaxial silicon layers 10 on a source region 7 and a drain region 8 are identical to those of the embodiment 1 described with reference to FIGS. 1 to 3, and hence redundant description is omitted.

Referring to FIG. 11, oxygen ions are injected into the overall surface of a silicon substrate 1 through a step similar to that in the embodiment 4, and thereafter the silicon substrate 1 is heat-treated. The injection conditions for the oxygen ions and the heat treatment for the silicon substrate 1 are identical to those in the embodiment 4.

Figure 12:
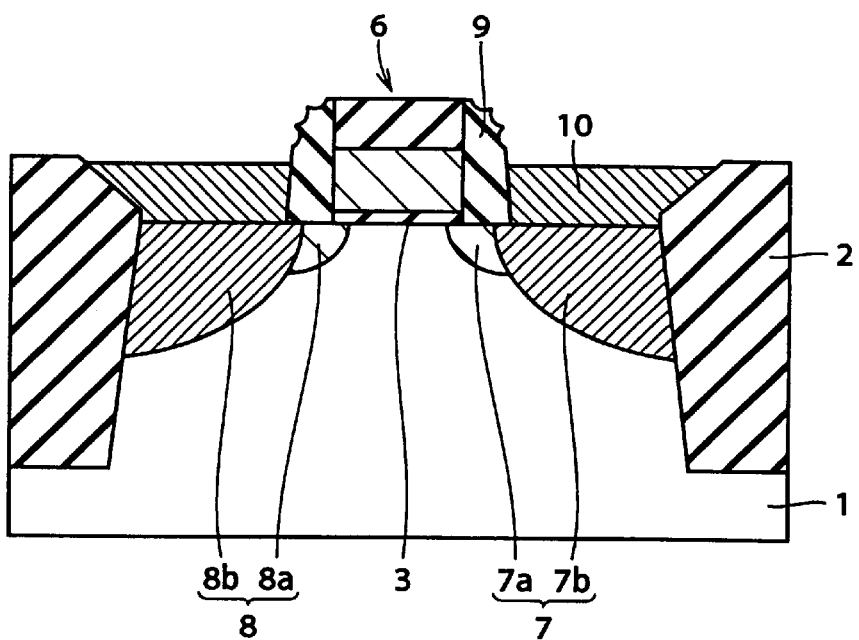
FIG. 12 is a sectional view showing a step of removing silicon fragments 10a in the method of fabricating a field-effect transistor according to the embodiment 5 of the present invention.

Referring to FIG. 12, the silicon substrate 1 is dipped in a solution of hydrofluoric acid. The concentration of the hydrofluoric acid solution is preferably 0.1% to 5.0% and the time for dipping the silicon substrate 1 therein is preferably 10 seconds to 300 seconds, similarly to the embodiment 2. Thus, silicon oxide films 11 are dissolved in the hydrofluoric acid solution. At this time, silicon fragments 10a covered with the silicon oxide films 11 precipitate in the hydrofluoric acid solution to disappear, as shown in FIG. 12. Thereafter a field-effect transistor is completed through steps similar to those in the embodiment 1 shown in FIGS. 5 to 8.

In the aforementioned method of fabricating a field-effect transistor according to the embodiment 5, the injection rate of the oxygen ions for oxidizing the silicon fragments 10a may not be appreciably increased as compared with the method of fabricating a field-effect transistor according to the embodiment 3. As compared with the case of only thermally oxidizing the silicon fragments 10a, the time for heat-treating the silicon substrate 1 can be reduced.

Further, isolation between a source electrode 18 and a drain electrode 19 is improved by removing the silicon oxide films 11 through etching with hydrofluoric acid, and a field-effect transistor having high electrical reliability can be formed. Further, the possibility of reducing the heat treatment time is advantageous for formation of a shallow junction.

[Embodiment 6]

The method of fabricating a field-effect transistor according to the embodiment 6 is described with reference to FIGS. 13 and 14. Steps up to that for forming epitaxial silicon layers 10 on a source region 7 and a drain region 8 are identical to those of the embodiment 1 described with reference to FIGS. 1 to 3, and hence redundant description is omitted.

Figure 13:
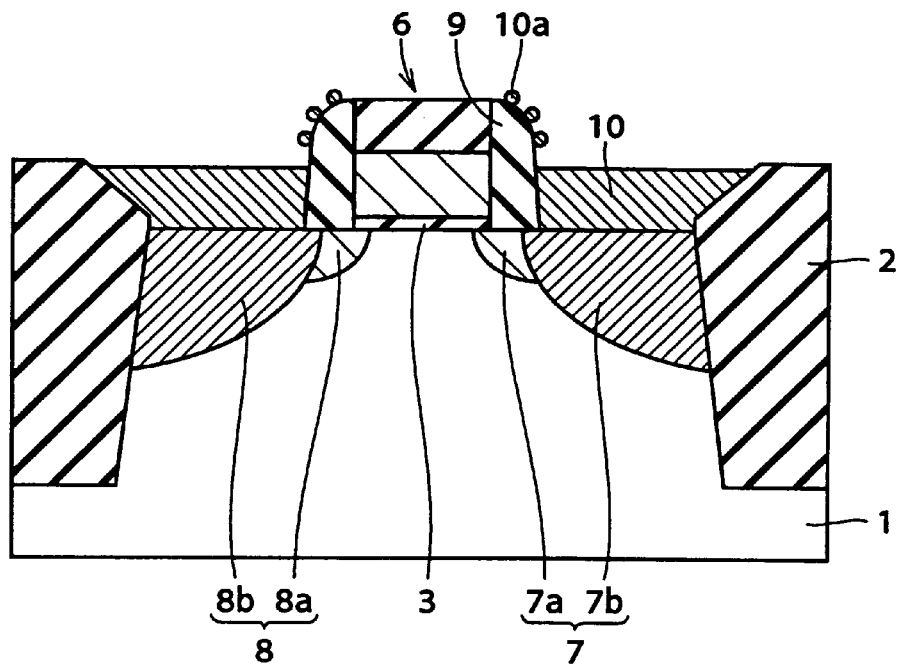
FIG. 13 is a sectional view showing a step of forming epitaxial silicon layers 10 in a method of fabricating a field-effect transistor according to each of embodiments 6, 7, 8, 11, 12, 13 and 14 of the present invention.

Referring to FIG. 13, the epitaxial silicon layers 10 are formed through a step similar to that in the embodiment 1. At this time, silicon fragments 10a are formed on side walls 9.

Figure 14:
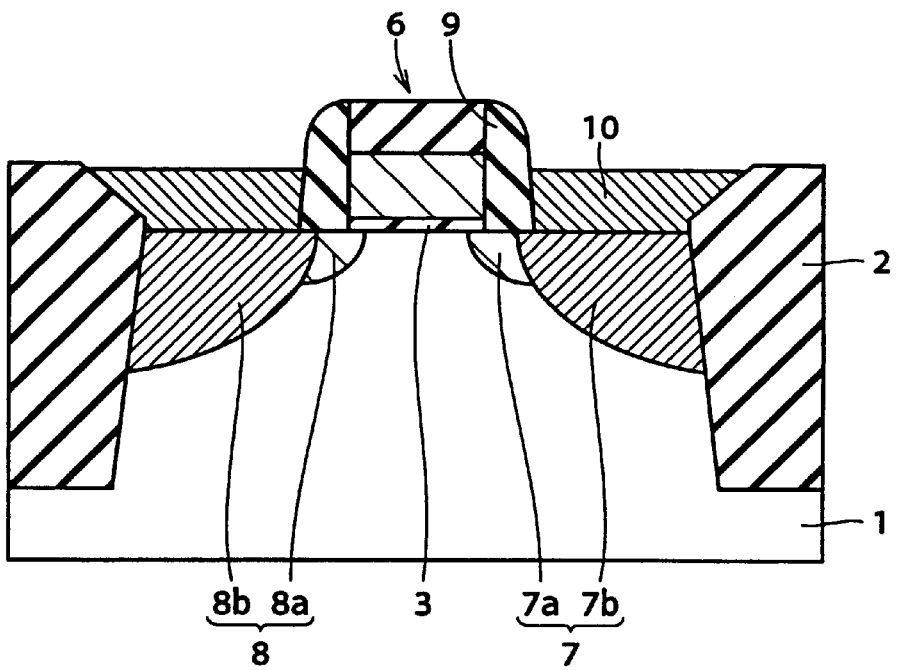
FIG. 14 is a sectional view showing a step of removing silicon fragments 10a in the method of fabricating a field-effect transistor according to each of the embodiments 6, 7, 8, 11, 12, 13 and 14 of the present invention.

Referring to FIG. 14, the silicon substrate 1 is then dipped in a mixed solution of hydrofluoric acid and nitric acid. At this time, the etching rate for the silicon fragments 10a, having larger surface areas exposed to the mixed solution as compared with the epitaxial silicon layers 10, is faster. Further, the mean thickness of the silicon fragments 10a formed on the side walls 9 is smaller than that of the epitaxial silicon layers 10. Therefore, the epitaxial silicon layers 10 can be left after dissolving all silicon fragments 10a in the mixed solution by setting a prescribed dipping time. The dipping time is varied with the temperature and concentration of the mixed solution. For example, the dipping time for a mixed solution containing hydrofluoric acid, nitric acid and water in the ratios of 1:60:60 is about 1 second to 100 seconds.

Thereafter a field-effect transistor is completed through steps similar to those in the embodiment 1 shown in FIGS. 5 to 8.

In the aforementioned method of fabricating a field-effect transistor according to the embodiment 6, the silicon fragments 10a are so removed that upper portions of the side walls 9 can be prevented from formation of excess salicide layers in a later step of forming salicide.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction. [Embodiment 7]

The method of fabricating a field-effect transistor according to the embodiment 7 is described with reference to FIGS. 13 and 14, similarly to the embodiment 6. Steps up to that for forming epitaxial silicon layers 10 on a source region 7 and a drain region 8 are identical to those of the embodiment 1 described with reference to FIGS. 1 to 3, and hence redundant description is omitted. A silicon substrate 1 is prepared from that having a major surface oriented in the (111) direction.

Referring to FIG. 13, the epitaxial silicon layers 10 are formed through a step similar to that in the embodiment 1. At this time, silicon fragments 10a are formed on side walls 9. The silicon fragments 10a have no such orientation as that of the silicon substrate 1.

Referring to FIG. 14, the silicon substrate 1 is dipped in a solution of potassium hydroxide (KOH). The time for dipping the silicon substrate 1 in the KOH solution of 5 moles/l is about 1 second to 100 seconds.

The KOH solution, known as a selective etching solution for silicon, has a slow etching rate for the (111) plane. The etching rate for the silicon fragments 10a with the KOH solution is remarkably higher than that for the silicon epitaxial layers 10 due to the difference in crystal orientation between the silicon epitaxial layers 10 and the silicon fragments 10a.

Further, the etching rate for the silicon fragments 10a, having larger surface areas exposed to the KOH solution as compared with the epitaxial silicon layers 10, is increased. In addition, the mean thickness of the silicon fragments 10a formed on the side walls 9 is smaller than that of the epitaxial silicon layers 10.

Therefore, the silicon fragments 10a can be completely removed by setting a dipping time for sufficiently leaving the epitaxial silicon layers 10. The dipping time is varied with the temperature and concentration of the KOH solution. Thereafter a field-effect transistor is completed through steps similar to those in the embodiment 1 shown in FIGS. 5 to 8.

In the aforementioned method of fabricating a field-effect transistor according to the embodiment 7, the silicon fragments 10a are so removed that upper portions of the side walls 9 can be prevented from formation of excess salicide layers in a later step of forming salicide.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

[Embodiment 8]

The method of fabricating a field-effect transistor according to the embodiment 8 is described with reference to FIGS. 13 and 14, similarly to the embodiments 6 and 7. Steps up to that for forming epitaxial silicon layers 10 on a source region 7 and a drain region 8 are identical to those of the embodiment 1 described with reference to FIGS. 1 to 3, and hence redundant description is omitted.

Referring to FIG. 13, the epitaxial silicon layers 10 are formed through a step similar to that in the embodiment 1. At this time, silicon fragments 10a are formed on side walls 9.

Referring to FIG. 14, a silicon substrate 1 is exposed to a plasma atmosphere of fluorine and oxygen. At this time, the silicon fragments 10a can be isotropically etched through chemical reaction with the plasma of fluorine without applying an electric field between the silicon substrate 1 and the plasma in particular.

The etching rate for the silicon fragments 10a, having larger surface areas exposed to the plasma as compared with the epitaxial silicon layers 10, is increased. Further, the mean thickness of the silicon fragments 10a formed on the side walls 9 is smaller than that of the epitaxial silicon layers 10.

Therefore, the silicon fragments 10a can be completely removed by setting an etching time for sufficiently leaving the epitaxial silicon layers 10 after etching all silicon fragments 10a. Thereafter a field-effect transistor is completed through steps similar to those in the embodiment 1 shown in FIGS. 5 to 8.

In the aforementioned method of fabricating a field-effect transistor according to the embodiment 8, the silicon fragments 10a are so removed that upper portions of the side walls 9 can be prevented from formation of excess salicide layers in a later step of forming salicide.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

While fluorine is employed as halogen gas in this embodiment, a similar effect can be attained by employing chlorine, bromine, iodine or astatine in place of fluorine.

[Embodiment 9]

The method of fabricating a field-effect transistor according to the embodiment 9 is described with reference to FIGS. 15 to 19. Steps up to that for forming epitaxial silicon layers 10 on a source region 7 and a drain region 8 are identical to those of the embodiment 1 described with reference to FIGS. 1 to 3, and hence redundant description is omitted.

Figure 15:
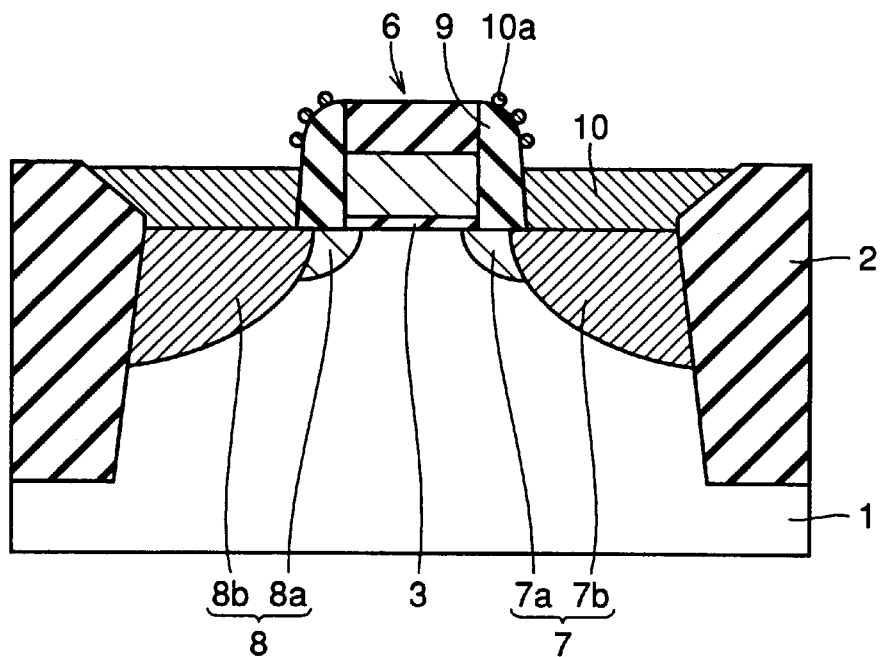
FIG. 15 is a sectional view showing a step of forming epitaxial silicon layers 10 in a method of fabricating a field-effect transistor according to an embodiment 9 of the present invention.

Referring to FIG. 15, the epitaxial silicon layers 10 are formed through a step similar to that in the embodiment 1. At this time, silicon fragments 10a are formed on side walls 9.

Figure 16:
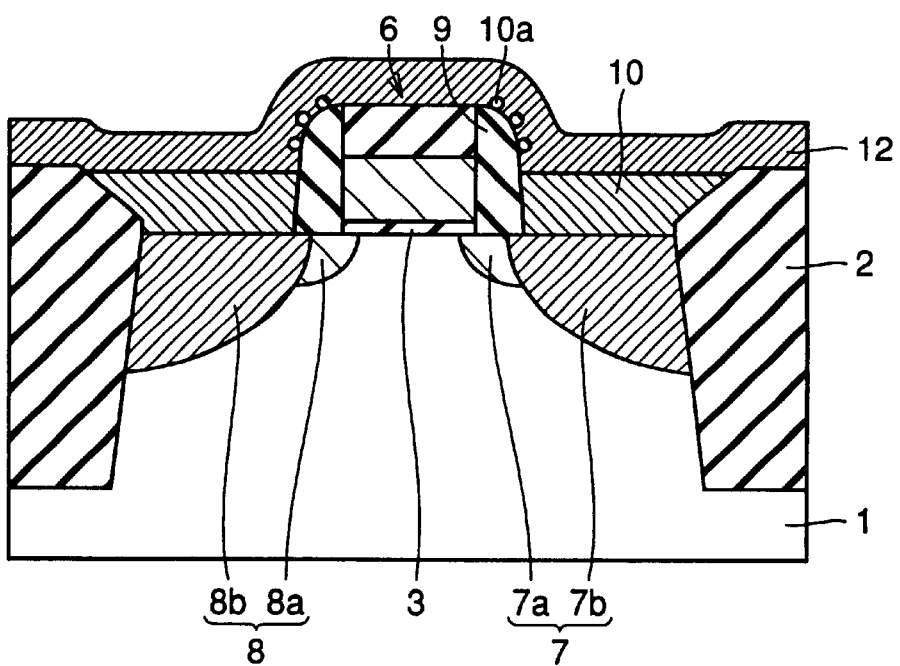
FIG. 16 is a sectional view showing a step of forming a metal thin film 12 in the method of fabricating a field-effect transistor according to the embodiment 9 of the present invention.
Figure 17:
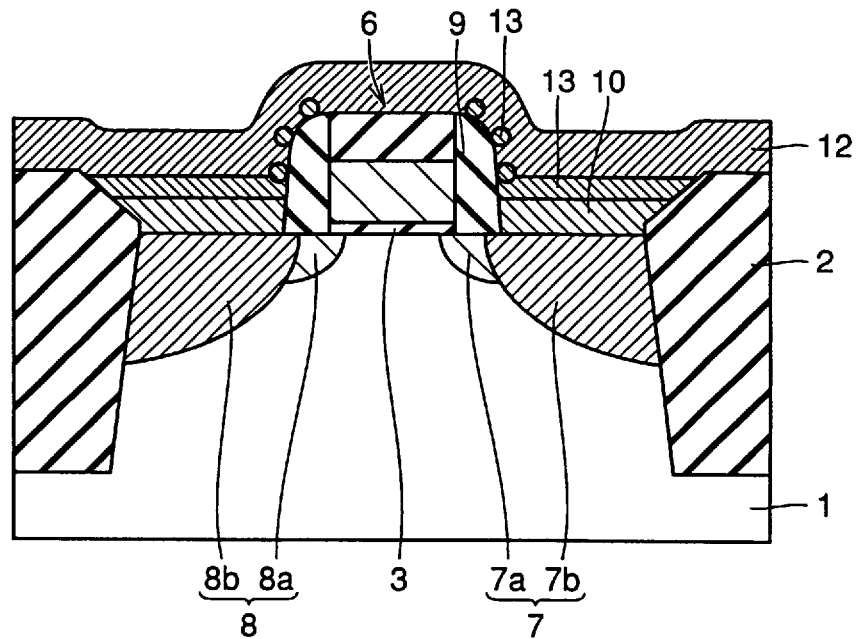
FIG. 17 is a sectional view showing a step of forming titanium silicide layers 13 in the method of fabricating a field-effect transistor according to the embodiment 9 of the present invention.

Referring to FIG. 16, a titanium film 12 is deposited by sputtering. The thickness of the titanium film 12 is 50 Å to 3000 Å. Referring to FIG. 17, a silicon substrate 1 including the titanium film 12 is heat-treated in a nitrogen atmosphere at 500° C. to 900°0 C. for 10 seconds to 300 seconds. Thus, titanium silicide layers 13 are formed on the interface between the silicon substrate 1 and the titanium film 12.

Figure 18:
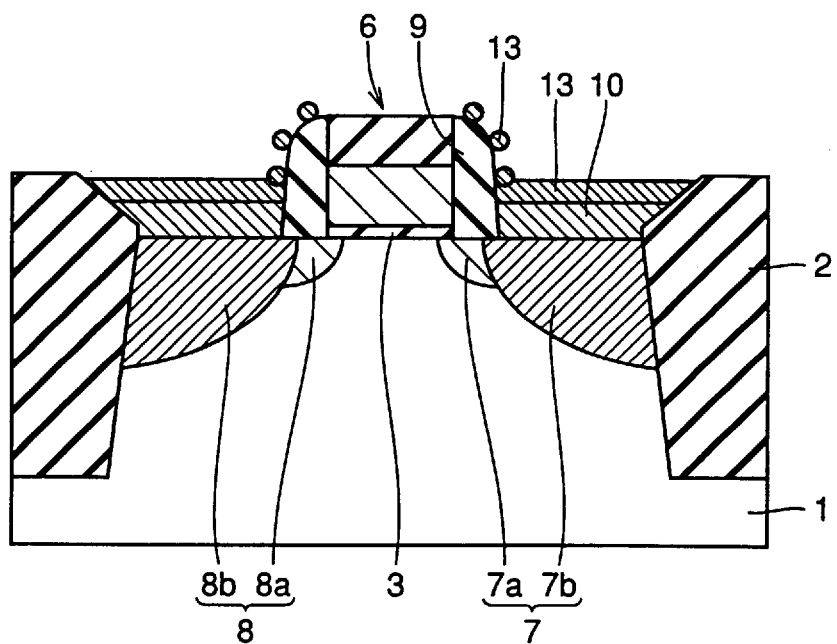
FIG. 18 is a sectional view showing a step of removing an unreacted part of the metal thin film 12 in the method of fabricating a field-effect transistor according to the embodiment 9 of the present invention.

Referring to FIG. 18, the silicon substrate 1 is dipped in a mixed solution containing sulfuric acid and hydrogen peroxide in the ratio of 4:1. Thus, the unreacted part of the titanium film 12 is removed.

Figure 19:
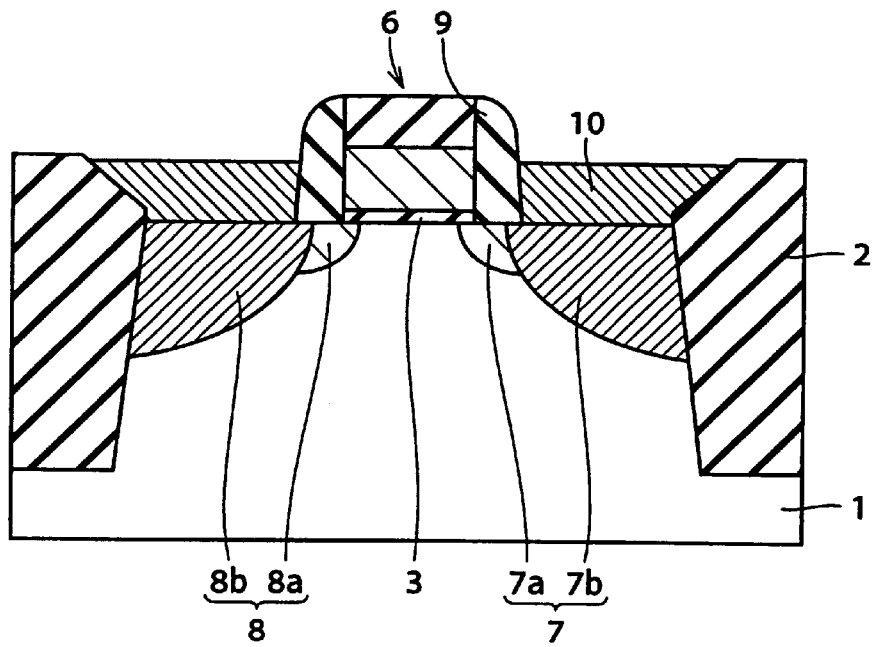
FIG. 19 is a sectional view showing a step of removing the titanium silicide layers 13 in the method of fabricating a field-effect transistor according to the embodiment 9 of the present invention.

Referring to FIG. 19, the titanium silicide layers 13 formed on the silicon substrate 1 are removed with hydrofluoric acid. Thereafter a field-effect transistor is completed through steps similar to those in the embodiment 1 shown in FIGS. 5 to 8.

In the method of fabricating a field-effect transistor according to the embodiment 9, the titanium film 12 and the epitaxial silicon layers 10 cause silicide reaction to form the titanium silicide layers 13. Then, the titanium silicide layers 13 are removed by dipping the silicon substrate 1 in the mixed solution of sulfuric acid and hydrogen peroxide. Thus, upper portions of the side walls 9 can be prevented from formation of excess salicide layers in a later step of forming salicide.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

While titanium is employed in this embodiment, a similar function/effect can be attained by employing hafnium, zirconium or cobalt in place of titanium.

[Embodiment 10]

The method of fabricating a field-effect transistor according to the embodiment 10 is described with reference to FIGS. 20 to 22. In this embodiment, the amount of silicon fragments 10a formed on side walls 9 is smaller than that in the embodiment 9. Steps up to that for forming epitaxial silicon layers 10 on a source region 7 and a drain region 8 are identical to those of the embodiment 1 described with reference to FIGS. 1 to 3, and hence redundant description is omitted.

Figure 20:
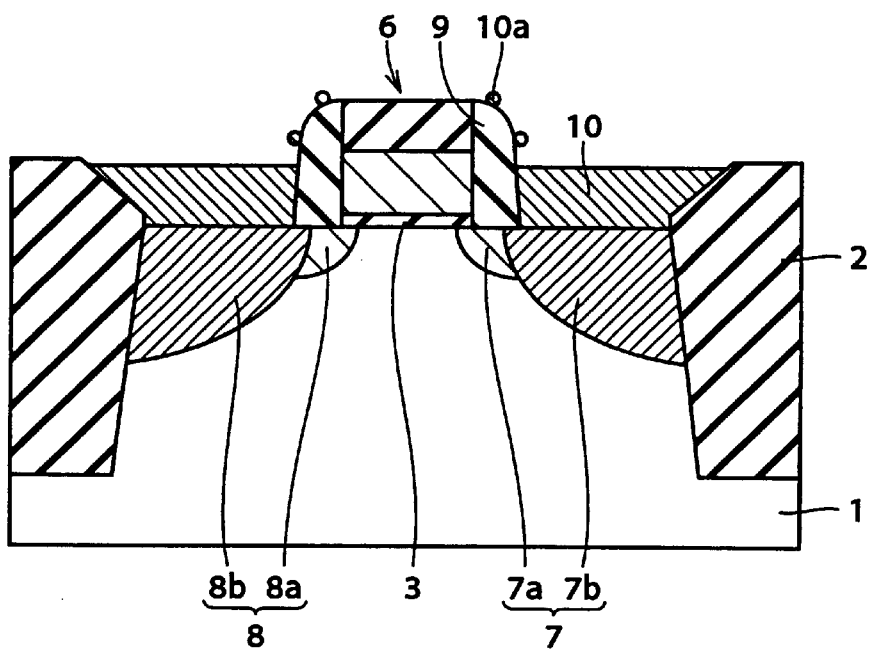
FIG. 20 is a sectional view showing a step of forming epitaxial silicon layers 10 in a method of fabricating a field-effect transistor according to an embodiment 10 of the present invention.
Figure 21:
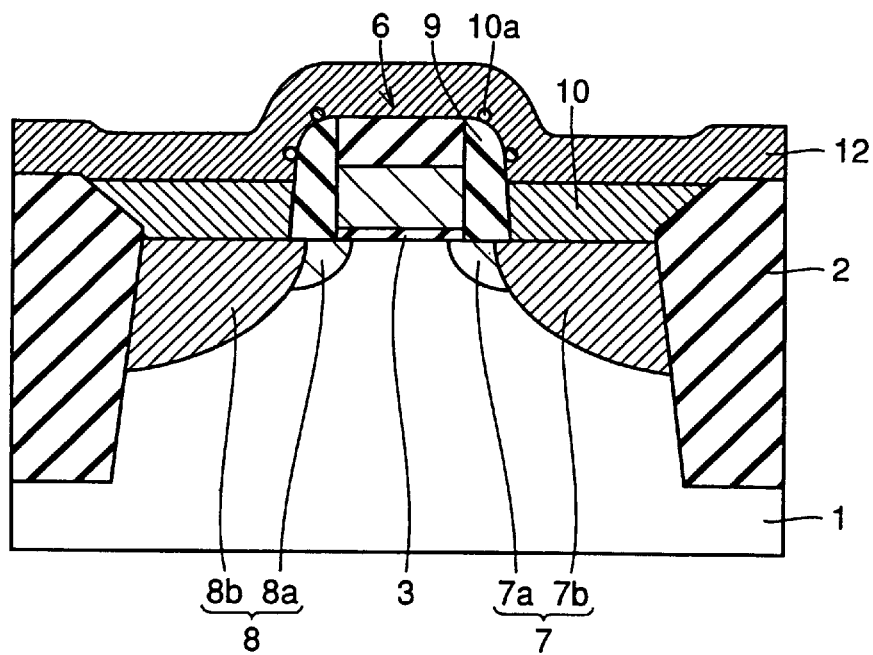
FIG. 21 is a sectional view showing a step of forming a metal thin film 12 in the method of fabricating a field-effect transistor according to the embodiment 10 of the present invention.

Referring to FIG. 20, the epitaxial silicon layers 10 are formed through a step similar to that in the embodiment 1. At this time, the silicon fragments 10a are formed on the side walls 9. The amount of the formed silicon fragments 10a is smaller than that in the embodiment 9. Referring to FIG. 21, a titanium film 12 is thereafter deposited by sputtering. The thickness of the titanium film 12 is 50 Å to 3000 Å, similarly to the embodiment 9.

Figure 22:
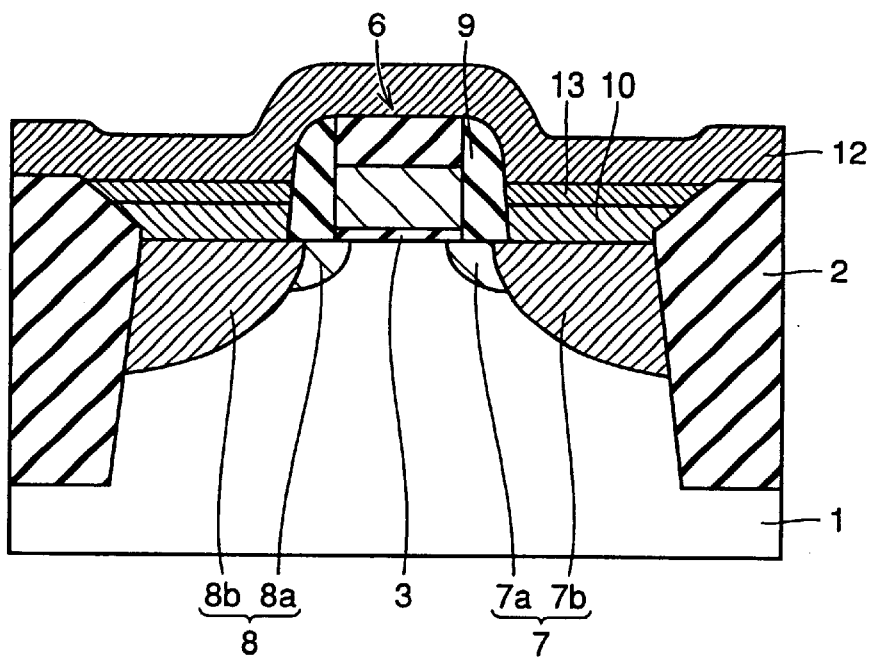
FIG. 22 is a sectional view showing a step of forming titanium silicide layers 13 in the method of fabricating a field-effect transistor according to the embodiment 10 of the present invention.

Referring to FIG. 22, a silicon substrate 1 including the titanium film 12 is heat-treated in a nitrogen atmosphere at 500° C. to 900° C. for 10 seconds to 300 seconds. Thus, titanium silicide layers 13 are formed on the interface between the silicon substrate 1 and the titanium film 12. The silicon fragments 10a provided in a sufficiently small amount are diffused in the titanium film 12 to disappear. Thereafter the silicon substrate 1 is dipped in a mixed solution of sulfuric acid and hydrogen peroxide, similarly to the embodiment 9 (see FIG. 18). The mixed solution contains sulfuric acid and hydrogen peroxide in the ratio of 4:1. Thus, the unreacted part of the titanium film 12 is removed. Thereafter a field-effect transistor is completed through steps similar to those in the embodiment 1 shown in FIGS. 5 to 8.

In the method of fabricating a field-effect transistor according to the embodiment 10, the titanium film 12 and the epitaxial silicon layers 10 cause silicide reaction to form the titanium silicide layers 13.

Then, the titanium silicide layers 13 formed on the epitaxial silicon layers 10 are removed by dipping the silicon substrate 1 in the mixed solution of sulfuric acid and hydrogen peroxide. Thus, upper portions of the side walls 9 can be prevented from formation of excess salicide layers in a later step of forming salicide.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

While titanium is employed in this embodiment, a similar function/effect can be attained by employing hafnium, zirconium or cobalt in place of titanium, similarly to the embodiment 9.

[Embodiment 11]

The method of fabricating a field-effect transistor according to the embodiment 11 is described with reference to FIGS. 13 and 14, similarly to the embodiments 6, 7 and 8. Steps up to that for forming epitaxial silicon layers 10 on a source region 7 and a drain region 8 are identical to those of the embodiment 1 described with reference to FIGS. 1 to 3, and hence redundant description is omitted.

Referring to FIG. 13, the epitaxial silicon layers 10 are formed through a step similar to that in the embodiment 1. At this time, silicon fragments 10a are formed on side walls 9.

Referring to FIG. 14, surfaces are polished with polishing cloth. At this time, the silicon fragments 10a are scraped off by the polishing. The silicon fragments 10a adhering to the side walls 9 have smaller adhesiveness than the epitaxial silicon layers 10. Thus, the silicon fragments 10a can be completely removed by setting the polishing conditions for not appreciably removing the epitaxial silicon layers 10 while removing the silicon fragments 10a formed on the side walls 9. A polishing solution prepared by adding colloidal silica or fumed silica to an organic amine solvent, a KOH solvent or an organic ammonia solvent is also employable.

Then, a field-effect transistor is completed through steps similar to those in the embodiment 1 shown in FIGS. 5 to 8.

In the method of fabricating a field-effect transistor according to the embodiment 11, the silicon fragments 10a are so removed that upper portions of the side walls 9 can be prevented from formation of excess salicide layers in a later step of forming salicide.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

While the surfaces are polished with the polishing cloth in this embodiment, a similar effect can be attained by polishing the surfaces with a brush or the like in place of the polishing cloth, as a matter of course.

[Embodiment 12]

The method of fabricating a field-effect transistor according to the embodiment 12 is described with reference to FIGS. 13 and 14, similarly to the embodiments 6, 7, 8 and 11. Steps up to that for forming epitaxial silicon layers 10 on a source region 7 and a drain region 8 are identical to those of the embodiment 1 described with reference to FIGS. 1 to 3, and hence redundant description is omitted.

Referring to FIG. 13, the epitaxial silicon layers 10 are formed through a step similar to that in the embodiment 1. At this time, silicon fragments 10a are formed on side walls 9.

Referring to FIG. 14, frozen water is collided with a surface of a silicon substrate 1 at a high speed. The silicon fragments 10a are scraped off due to this bombardment. The silicon fragments 10a adhering to the side walls 9 have smaller adhesiveness than the epitaxial silicon layers 10.

Thus, the silicon fragments 10a can be completely removed by setting the conditions for colliding the frozen water with the silicon substrate 1 for not appreciably removing the epitaxial silicon layers 10 while removing the silicon fragments 10a formed on the side walls 9. When the frozen water is formed by particles of 50 μm in thickness, the speed therefor is set at 100 m/s to 340 m/s.

Then, a field-effect transistor is completed through steps similar to those in the embodiment 1 shown in FIGS. 5 to 8.

In the method of fabricating a field-effect transistor according to the embodiment 12, the silicon fragments 10a are so removed that upper portions of the side walls 9 can be prevented from formation of excess salicide layers in a later step of forming salicide.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

While the frozen water is employed in this embodiment, a similar effect is attained by employing particulates prepared by freezing an organic solvent such as alcohol, those prepared by freezing rare gas such as neon, argon or krypton, or those forming a solid under the normal temperature such as grains of quartz.

[Embodiment 13]

The method of fabricating a field-effect transistor according to the embodiment 13 is described with reference to FIGS. 13 and 14, similarly to the embodiments 6, 7, 8, 11 and 12. Steps up to that for forming epitaxial silicon layers 10 on a source region 7 and a drain region 8 are identical to those of the embodiment 1 described with reference to FIGS. 1 to 3, and hence redundant description is omitted.

Referring to FIG. 13, the epitaxial silicon layers 10 are formed through a step similar to that in the embodiment 1. At this time, silicon fragments 10a are formed on side walls 9.

Referring to FIG. 14, ultrasonic waves are applied to a surface of a silicon substrate 1 through pure water while sprinkling the surface with the pure water. The silicon fragments 10a are removed due to action of the ultrasonic waves. The silicon fragments 10a adhering to the side walls 9 have smaller adhesiveness than the epitaxial silicon layers 10.

Thus, the silicon fragments 10a formed on the side walls 9 can be completely removed while not appreciably removing the epitaxial silicon layers 10.

Then, a field-effect transistor is completed through steps similar to those in the embodiment 1 shown in FIGS. 5 to 8.

In the method of fabricating a field-effect transistor according to the embodiment 13, the silicon fragments 10a are so removed that upper portions of the side walls 9 can be prevented from formation of excess salicide layers in a later step of forming salicide.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

[Embodiment 14]

The method of fabricating a field-effect transistor according to the embodiment 14 is described with reference to FIGS. 13 and 14, similarly to the embodiments 6, 7, 8, 11, 12 and 13. Steps up to that for forming epitaxial silicon layers 10 on a source region 7 and a drain region 8 are identical to those of the embodiment 1 described with reference to FIGS. 1 to 3, and hence redundant description is omitted.

Referring to FIG. 13, the epitaxial silicon layers 10 are formed through a step similar to that in the embodiment 1. At this time, silicon fragments 10a are formed on side walls 9.

Referring to FIG. 14, a surface of a silicon substrate 1 is exposed to chlorine gas. At this time, the silicon fragments 10a are removed due to etching action of the chlorine gas. The etching rate for the silicon fragments 10a, having larger surface areas exposed to the halogen gas as compared with the epitaxial silicon layers 10, is increased. Further, the mean thickness of the silicon fragments 10a formed on the side walls 9 is smaller than that of the epitaxial silicon layers 10.

Therefore, the silicon fragments 10a can be removed while not appreciably etching the silicon epitaxial layers 10. The pressure of the chlorine gas is set at $1 \times 10^{-4}$ Torr to $1 \times 10^{-7}$ Torr.

Then, a field-effect transistor is completed through steps similar to those in the embodiment 1 shown in FIGS. 5 to 8.

In the method of fabricating a field-effect transistor according to the embodiment 14, the silicon fragments 10a are so removed that upper portions of the side walls 9 can be prevented from formation of excess salicide layers in a later step of forming salicide.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

The silicon fragments 10a can be more effectively removed by combining the method of fabricating a field-effect transistor according to each of the embodiments 6 to 14 with that according to each of the embodiments 1 to 5.

[Embodiment 15]

The method of fabricating a field-effect transistor according to the embodiment 15 is described with reference to FIGS. 23 to 30. This embodiment corresponds to the method of fabricating a field-effect transistor according to the embodiment 1, except the structure of a gate electrode.

Figure 23:
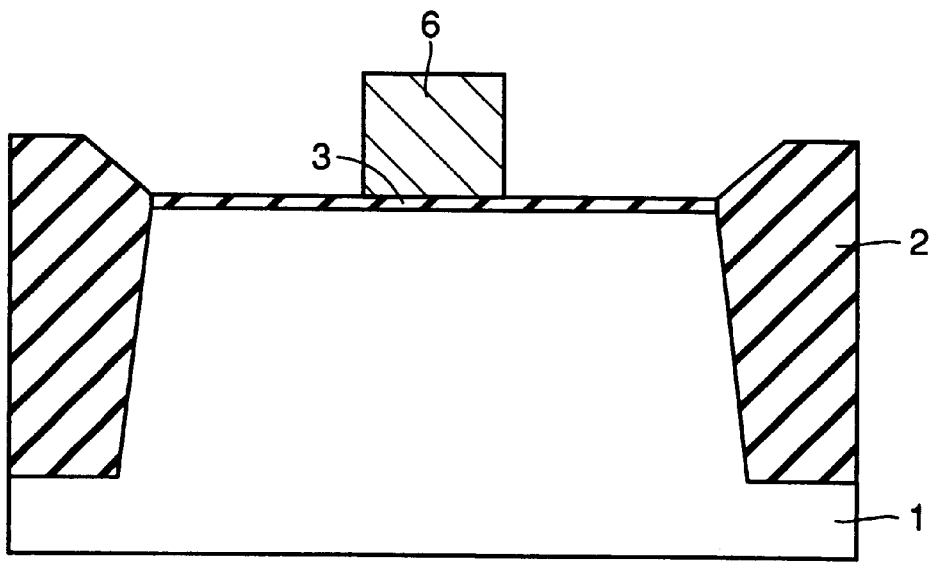
FIG. 23 is a sectional view showing a step of forming a gate electrode 6 in a method of fabricating a field-effect transistor according to an embodiment 15 of the present invention.

Referring to FIG. 23, element isolation films 2 consisting of silicon oxide films or the like are formed on a major surface of a silicon substrate 1 by trench isolation. The element isolation films 2 define an active region for forming a MOS transistor or the like on the surface of the silicon substrate 1. Thereafter a gate insulator film 3 consisting of a silicon oxide film or the like is formed on the active region of the silicon substrate 1 by thermal oxidation.

A polysilicon film is deposited on the major surface of the silicon substrate. Thereafter a photoresist film having a prescribed pattern is formed on the polysilicon film and employed as a mask for anisotropically etching the polysilicon film and patterning the polysilicon film, for completing a gate electrode 6 of polysilicon.

Figure 24:
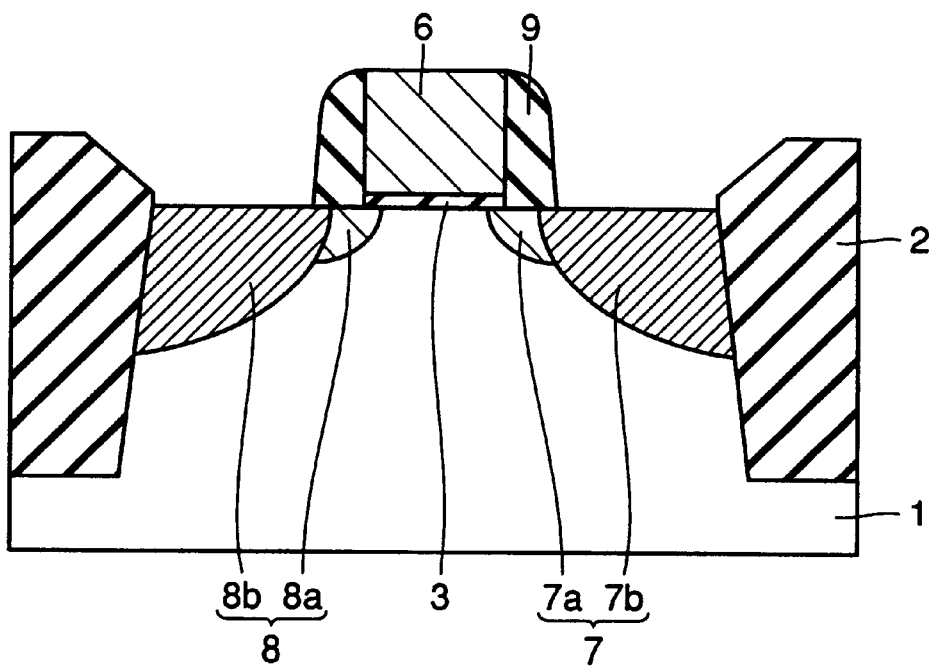
FIG. 24 is a sectional view showing a step of forming source/drain regions 7 and 8 in the method of fabricating a field-effect transistor according to the embodiment 15 of the present invention.

Referring to FIG. 24, an impurity is ion-implanted into the silicon substrate 1 through the gate electrode 6 serving as a mask, for forming n⁻ impurity regions 7a and 8a. Thereafter side walls 9 consisting of silicon nitride films are formed on side surfaces of the gate electrode 6. Thereafter an impurity is ion-implanted into the silicon substrate 1 through the gate electrode 6 and the side walls 9 serving as masks, for forming n⁺ impurity regions 7b and 8b. Thus, a source region 7 and a drain region 8 are completed.

Figure 25:
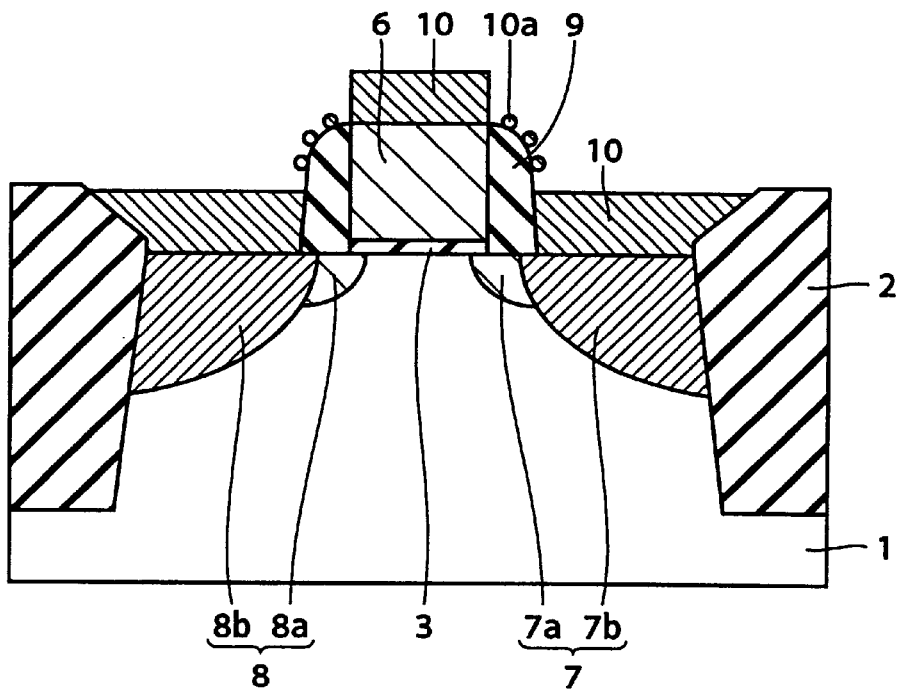
FIG. 25 is a sectional view showing a step of forming epitaxial silicon layers 10 in the method of fabricating a field-effect transistor according to the embodiment 15 of the present invention.

Referring to FIG. 25, epitaxial silicon layers 10 are formed on the source region 7 and the drain region 8 through chemical vapor deposition such as solid-phase epitaxy or vapor-phase selective epitaxy, for example. If the thickness of the epitaxial silicon layers 10 exceeds a critical value due to process fluctuation or the like at this time, silicon fragments 10a are formed on the side walls 9. In this embodiment employing silicon nitride films for the side walls 9, the silicon fragments 10a are readily formed on the side walls 9 in particular.

Figure 26:
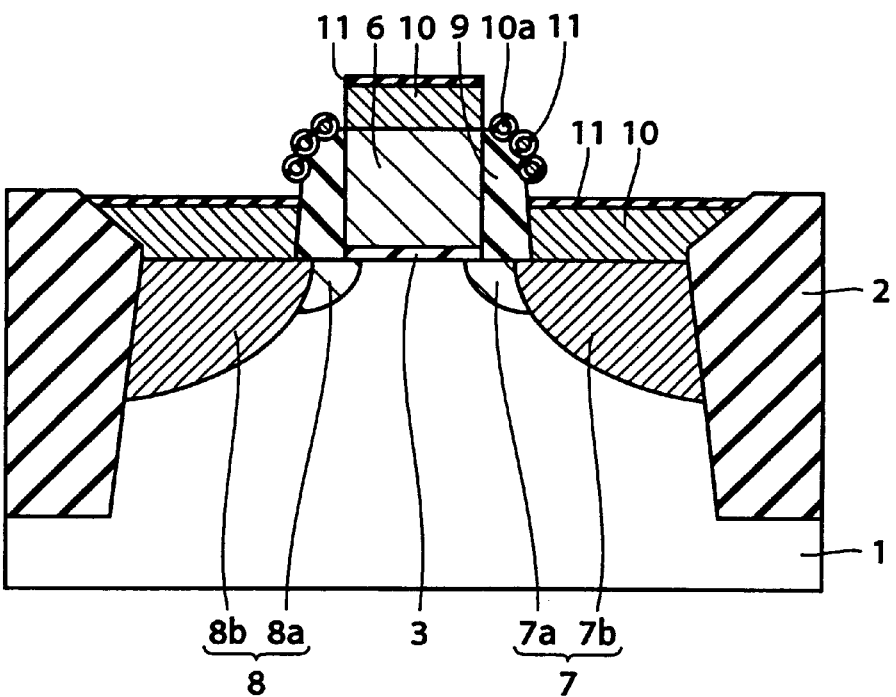
FIG. 26 is a sectional view showing a step of forming silicon oxide films 11 in the method of fabricating a field-effect transistor according to the embodiment 15 of the present invention.

Referring to FIG. 26, the silicon substrate 1 is exposed to an oxygen atmosphere of 600° C. to 900° C., for forming silicon oxide films 11 on surfaces of the epitaxial silicon layers 10 and those of the silicon fragments 10a. At this time, the silicon oxide films 11 having the same withstand voltage characteristics can be formed at a lower oxidation temperature by simultaneously mixing hydrogen or moisture. Thereafter an impurity is introduced into the epitaxial silicon layers 10 by ion implantation.

Figure 27:
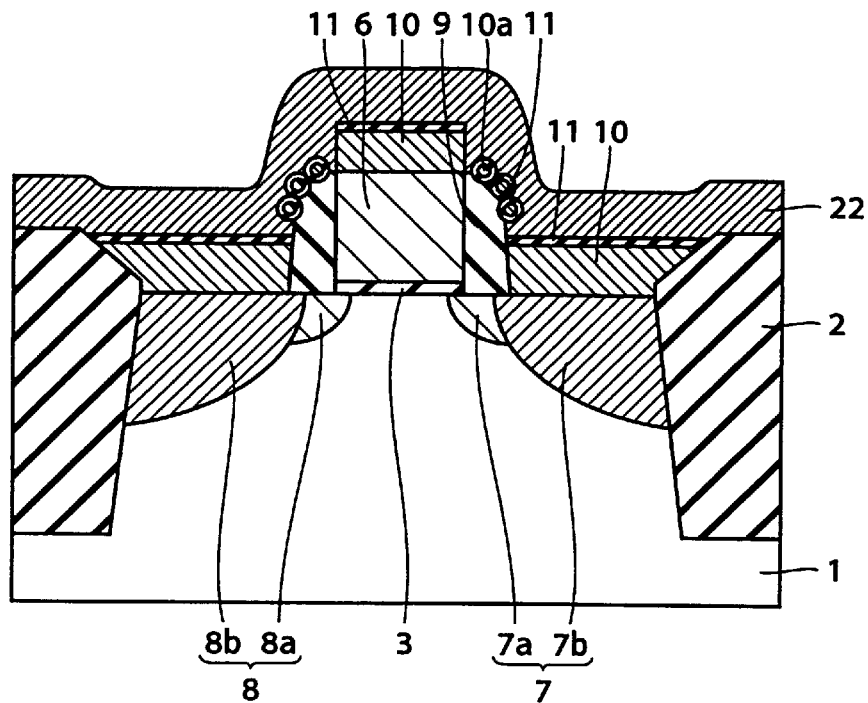
FIG. 27 is a sectional view showing a step of forming a metal thin film 22 in the method of fabricating a field-effect transistor according to the embodiment 15 of the present invention.
Figure 28:
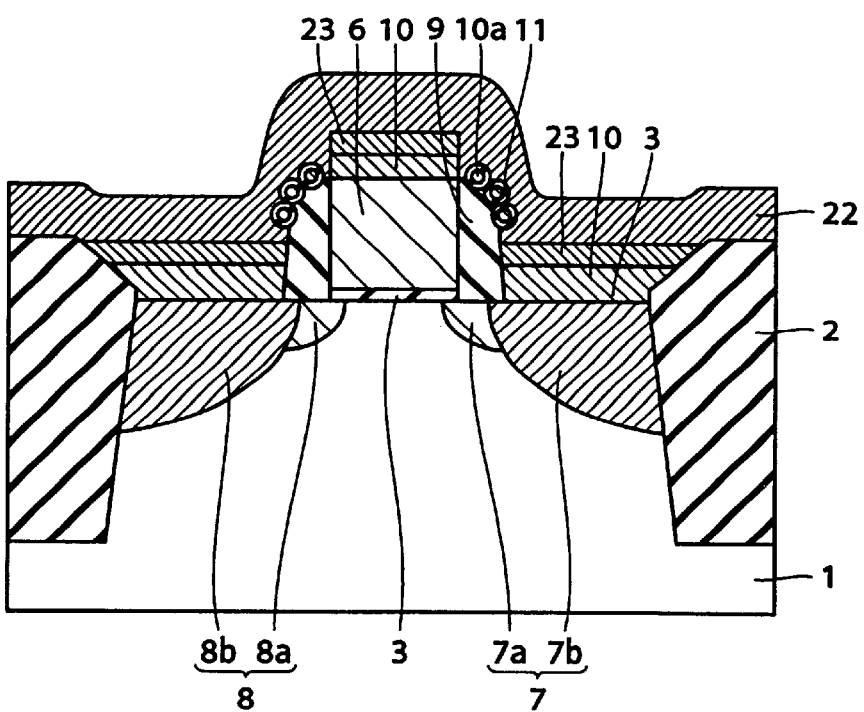
FIG. 28 is a sectional view showing a step of forming titanium silicide layers 23 in the method of fabricating a field-effect transistor according to the embodiment 15 of the present invention.

Referring to FIG. 27, a metal thin film 22 of titanium is formed on the silicon substrate 1 by sputtering or the like. Referring to FIG. 28, the silicon substrate 1 is thereafter heat-treated at a high temperature for reacting the epitaxial silicon layers 10 with the metal thin film 22 and forming titanium silicide layers 23.

Figure 29:
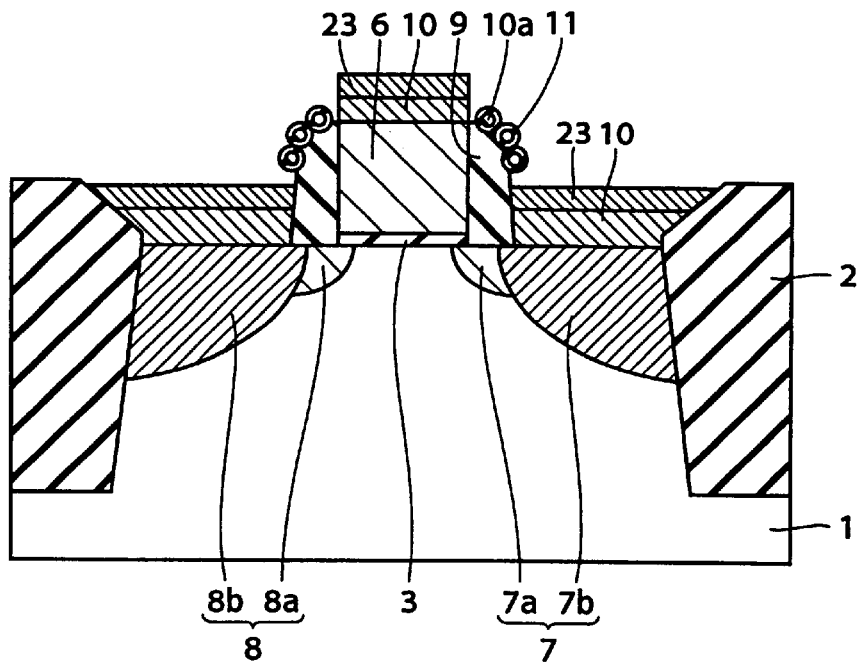
FIG. 29 is a sectional view showing a step of removing an unreacted part of the metal thin film 22 in the method of fabricating a field-effect transistor according to the embodiment 15 of the present invention.

Referring to FIG. 29, the unreacted part of the metal thin film 22 is removed with the mixture of sulfuric acid and hydrogen peroxide, and the like.

Figure 30:
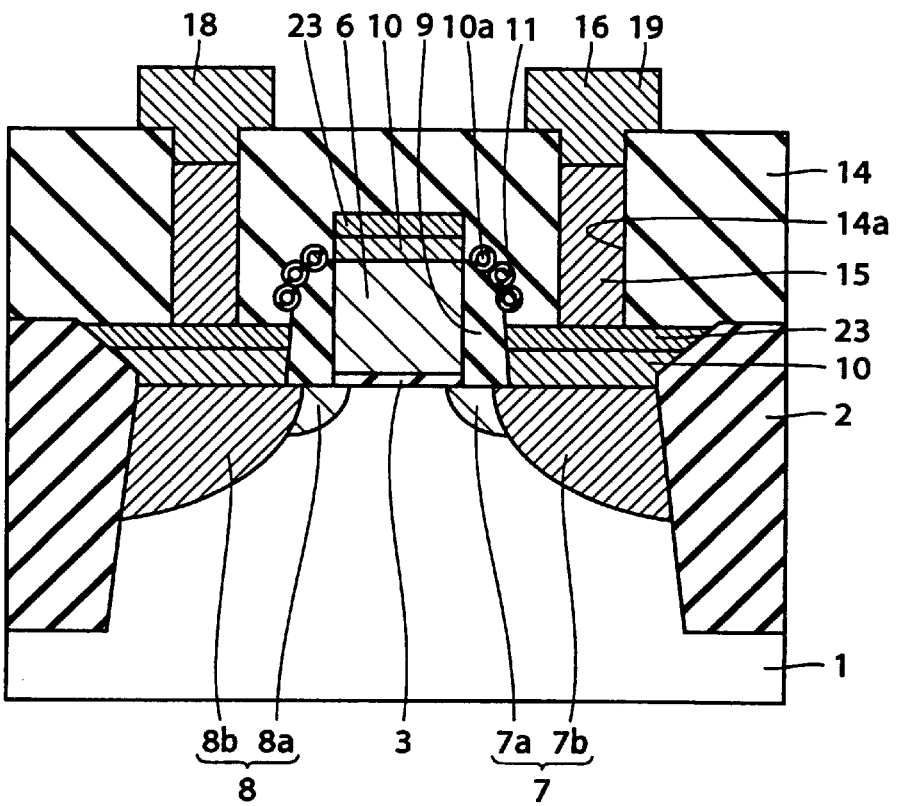
FIG. 30 is a sectional view showing a step of forming a source electrode 18 and a drain electrode 19 in the method of fabricating a field-effect transistor according to the embodiment 15 of the present invention.

Referring to FIG. 30, an interlayer isolation film 14 is formed on the silicon substrate 1 by chemical vapor deposition or the like. Thereafter contact holes 14a are formed in the interlayer isolation film 14. Thereafter tungsten plugs 15 and aluminum wiring layers 16 are formed by a well-known technique for completing a source electrode 18 and a drain electrode 19. According to this embodiment, a field-effect transistor having the gate electrode 6, the source electrode 18 and the drain electrode 19 is completed through the aforementioned steps.

In the aforementioned method of fabricating a field-effect transistor according to the embodiment 15, the silicon substrate 1 is exposed to the atmosphere containing oxygen similarly to the embodiment 1, for forming the silicon oxide films 11 on the surfaces of the silicon fragments 10a. Consequently, an electrical conducting state caused by the silicon fragments 10a can be avoided, isolation between the source electrode 18 and the drain electrode 19 is improved, and a field-effect transistor having high electrical reliability can be formed.

[Embodiment 16]

The method of fabricating a field-effect transistor according to the embodiment 16 is described with reference to FIGS. 31 and 32. Steps up to that for forming epitaxial silicon layers 10 on a source region 7 and a drain region 8 are identical to those of the embodiment 15 described with reference to FIGS. 23 to 25, and hence redundant description is omitted. This embodiment corresponds to the method of fabricating a field-effect transistor according to the embodiment 2, except the structure of a gate electrode.

Figure 31:
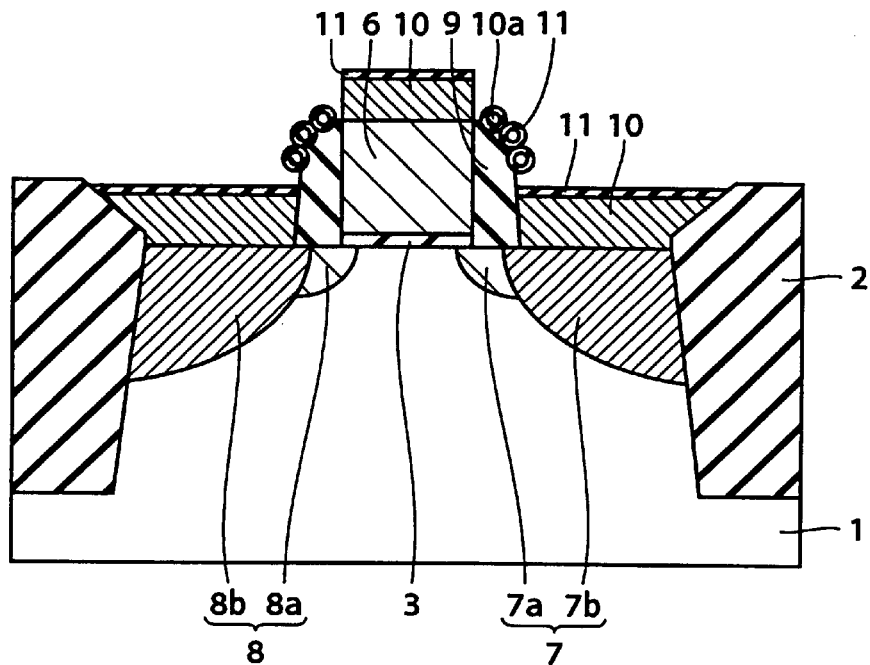
FIG. 31 is a sectional view showing a step of forming silicon oxide films 11 in a method of fabricating a field-effect transistor according to an embodiment 16 of the present invention.

Referring to FIG. 31, a silicon substrate 1 is exposed to an oxygen atmosphere of 600° C. to 900° C. for forming silicon oxide films 11 on surfaces of the epitaxial silicon layers 10 and those of the silicon fragments 10a, similarly to the embodiment 15 (see FIG. 26). At this time, the silicon oxide films 11 having the same withstand voltage characteristics can be formed at a lower oxidation temperature by simultaneously mixing hydrogen or moisture.

Figure 32:
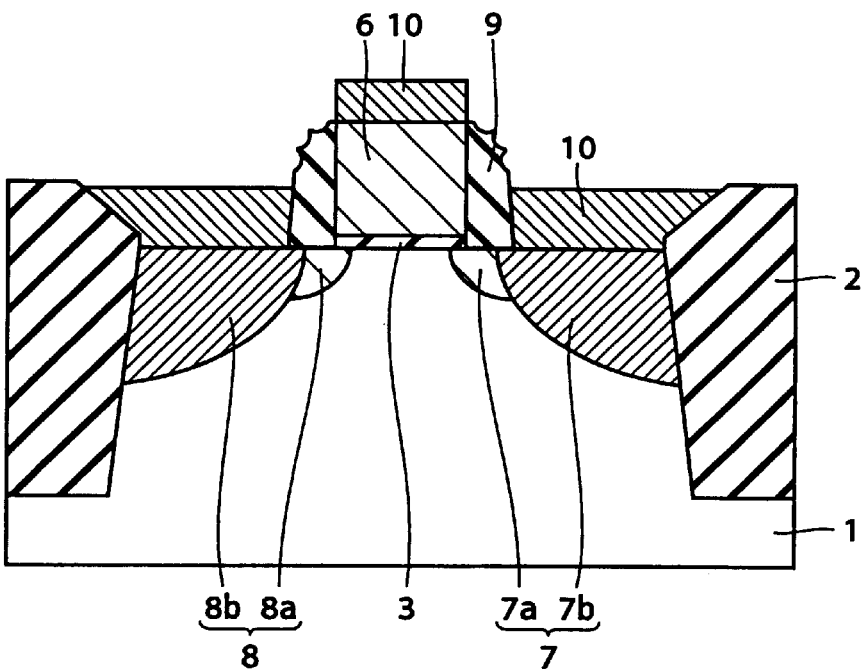
FIG. 32 is a sectional view showing a step of removing silicon fragments 10*a* in the method of fabricating a field-effect transistor according to the embodiment 16 of the present invention.

Referring to FIG. 32, the silicon substrate 1 is dipped in a solution of hydrofluoric acid The concentration of the hydrofluoric acid solution is preferably 0.1% to 5.0%, and the time for dipping the silicon substrate 1 therein is preferably 10 seconds to 300 seconds. Thus, the silicon oxide films 11 are dissolved in the hydrofluoric add solution. At this time, the silicon fragments 10a covered with the silicon oxide films 11 shown in FIG. 31 precipitate in the hydrofluoric add solution to disappear. Thereafter an impurity is introduced into the epitaxial silicon layers 10 by ion implantation. Thereafter a field-effect transistor is completed through steps similar to those in the embodiment 15 shown in FIGS. 27 to 30.

In the aforementioned method of fabricating a field-effect transistor according to the embodiment 16, the silicon substrate 1 is exposed to the atmosphere containing oxygen for forming the silicon oxide films 11 on the surfaces of the silicon fragments 10a, similarly to the embodiment 2. Further, the silicon oxide films 11 are removed by etching with hydrofluoric acid, for improving isolation between a source electrode 18 and a drain electrode 19. Thus, a field-effect transistor having high electrical reliability can be formed.

[Embodiment 17]

The method of fabricating a field-effect transistor according to the embodiment 17 is described with reference to FIG. 33. Steps up to that for forming epitaxial silicon layers 10 on a source region 7 and a drain region 8 are identical to those of the embodiment 15 described with reference to FIGS. 23 to 25, and hence redundant description is omitted. This embodiment corresponds to the method of fabricating a field-effect transistor according to the embodiment 3, except the structure of a gate electrode.

Figure 33:
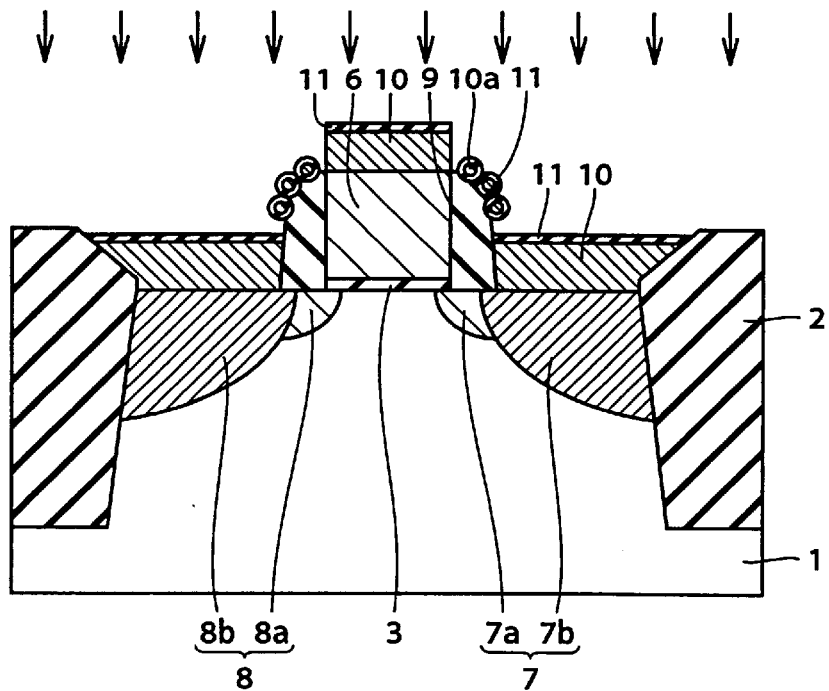
FIG. 33 is a sectional view showing an oxygen ion introduction step in a method of fabricating a field-effect transistor according to each of embodiments 17, 18 and 19 of the present invention.

Referring to FIG. 33, the epitaxial silicon layers 10 are formed through a step similar to that in the embodiment 15. At this time, silicon fragments 10a are formed on side walls 9.

Then, oxygen ions are injected into the overall surface of a silicon substrate 1. The oxygen ions are injected under injection energy of 2 keV to 20 keV at an injection rate of $1\times10^{15}$ cm$^{-2}$ to $1\times10^{21}$ cm$^{-2}$. Thus, insulating silicon oxide films 11 are formed on surfaces of the silicon fragments 10a and the epitaxial silicon films 10.

As to the technique of forming silicon oxide films by injecting oxygen ions, "Formation of SiO₂ Films by Oxygen-Ion Bombardment", Japanese Journal of Applied Physics 5, pp. 737 to 738 (1966) can be referred to, similarly to the embodiment 3. Thereafter a field-effect transistor is completed through steps similar to those in the embodiment 15 shown in FIGS. 27 to 30.

In the aforementioned method of fabricating a field-effect transistor according to the embodiment 17, the silicon fragments 10a can be oxidized similarly to the embodiment 3. Consequently, isolation between a source electrode 18 and a drain electrode 19 is improved and a field-effect transistor having high electrical reliability can be formed. Further, the possibility of oxidizing the silicon fragments 10a with no heat treatment is advantageous for formation of a shallow junction.

[Embodiment 18]

The method of fabricating a field-effect transistor according to the embodiment 18 is described with reference to FIG. 33, similarly to the embodiment 17. Steps up to that for forming epitaxial silicon layers 10 on a source region 7 and a drain region 8 are identical to those of the embodiment 15 described with reference to FIGS. 23 to 25, and hence redundant description is omitted. This embodiment corresponds to the method of fabricating a field-effect transistor according to the embodiment 4, except the structure of a gate electrode.

Referring to FIG. 33, the epitaxial silicon layers 10 are formed through a step similar to that in the embodiment 15. At this time, silicon fragments 10a are formed on side walls 9.

Then, oxygen ions are injected into the overall surface of a silicon substrate 1. The oxygen ions are injected under injection energy of 2 keV to 20 keV at an injection rate of $1 \times 10^{14}$ cm$^{-2}$ to $1 \times 10^{20}$ cm$^{-2}$, dissimilarly to the embodiment 3.

Thus, insulating silicon oxide films 11 are formed on surfaces of the silicon fragments 10a and the epitaxial silicon films 10. Further, the silicon substrate 1 is heat-treated for facilitating formation of the silicon oxide films 11 with the oxygen ions. In case of employing Rapid Thermal annealing, the heat treatment is typically carried out in a nitrogen atmosphere at about 90° C. for 30 seconds. Thereafter a field-effect transistor is completed through steps similar to those in the embodiment 15 shown in FIGS. 27 to 30.

In the aforementioned method of fabricating a field-effect transistor according to the embodiment 18, the injection rate of the oxygen ions for oxidizing the silicon fragments 10a may not be appreciably increased as compared with the method of fabricating a field-effect transistor according to the embodiment 17. As compared with the case of only thermally oxidizing the silicon fragments 10a, the time for heat-treating the silicon substrate 1 can be reduced.

Consequently, isolation between a source electrode 18 and a drain electrode 19 is improved and a field-effect transistor having high electrical reliability can be formed. Further, the possibility of oxidizing the silicon fragments 10a with less heat treatment compared with a case of only thermally oxidizing the silicon fragments 10a is advantageous for formation of a shallow junction.

[Embodiment 19]

The method of fabricating a field-effect transistor according to the embodiment 19 is described with reference to FIGS. 33 and 34. Steps up to that for forming epitaxial silicon layers 10 on a source region 7 and a drain region 8 are identical to those of the embodiment 15 described with reference to FIGS. 23 to 25, and hence redundant description is omitted. This embodiment corresponds to the method of fabricating a field-effect transistor according to the embodiment 5, except the structure of a gate electrode.

Referring to FIG. 33, oxygen ions are injected into the overall surface of a silicon substrate 1 through a step similar to that in the embodiment 18, and thereafter the silicon substrate 1 is heat-treated. The injection conditions for the oxygen ions and the heat treatment for the silicon substrate 1 are identical to those in the embodiment 18.

Figure 34:
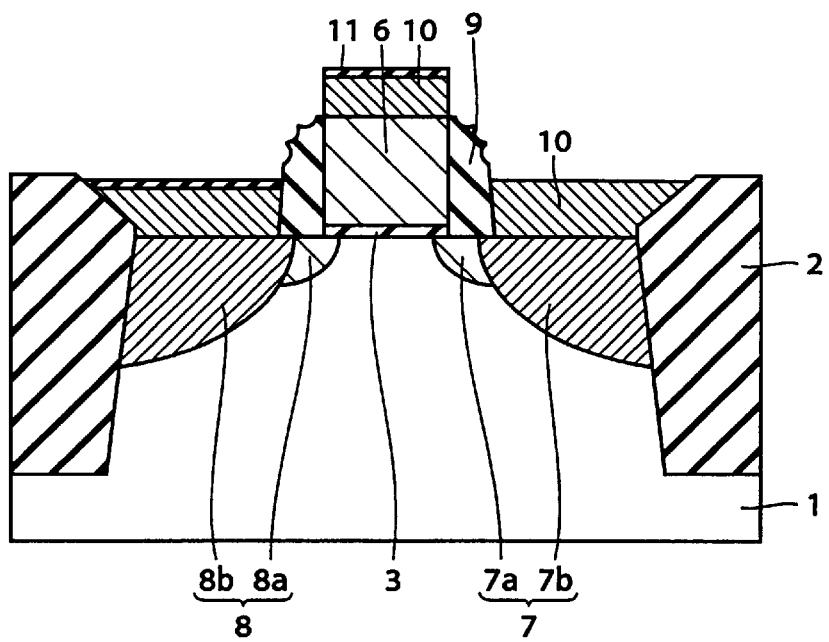
FIG. 34 is a sectional view showing a step of removing silicon fragments 10*a* in the method of fabricating a field-effect transistor according to the embodiment 19 of the present invention.

Referring to FIG. 34, the silicon substrate 1 is dipped in a solution of hydrofluoric acid. The concentration of the hydrofluoric acid solution is preferably 0.1% to 5.0% and the time for dipping the silicon substrate 1 therein is preferably 10 seconds to 300 seconds, similarly to the embodiment 16. Thus, silicon oxide films 11 are dissolved in the hydrofluoric acid solution. At this time, silicon fragments 10a covered with the silicon oxide films 11 precipitate in the hydrofluoric acid solution to disappear, as shown in FIG. 34. Thereafter a field-effect transistor is completed through steps similar to those in the embodiment 15 shown in FIGS. 27 to 30.

In the aforementioned method of fabricating a field-effect transistor according to the embodiment 19, the injection rate of the oxygen ions for oxidizing the silicon fragments 10a may not be appreciably increased as compared with the method of fabricating a field-effect transistor according to the embodiment 17. As compared with the case of only thermally oxidizing the silicon fragments 10a, the time for heat-treating the silicon substrate 1 can be reduced.

Further, isolation between a source electrode 18 and a drain electrode 19 is improved by removing the silicon oxide films 11 through etching with hydrofluoric acid, so that a field-effect transistor having high electrical reliability can be formed. Further, the possibility of reducing the heat treatment time is advantageous for formation of a shallow junction.

[Embodiment 20]

The method of fabricating a field-effect transistor according to the embodiment 20 is described with reference to FIGS. 35 and 36. Steps up to that for forming epitaxial silicon layers 10 on a source region 7 and a drain region 8 are identical to those of the embodiment 15 described with reference to FIGS. 23 to 25, and hence redundant description is omitted. This embodiment corresponds to the method of fabricating a field-effect transistor according to the embodiment 6, except the structure of a gate electrode.

Figure 35:
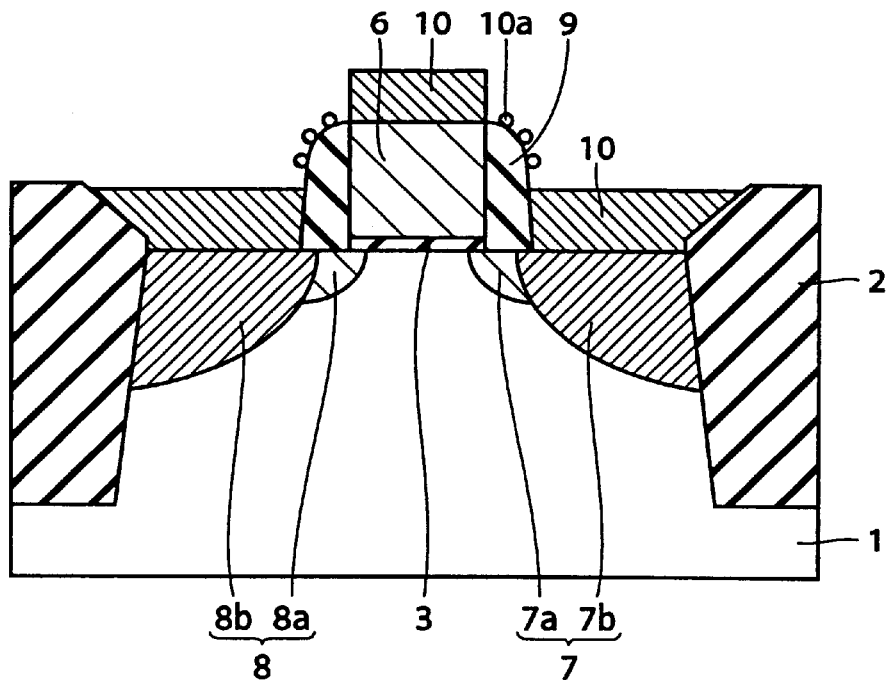
FIG. 35 is a sectional view showing a step of forming epitaxial silicon layers 10 in a method of fabricating a field-effect transistor according to each of embodiments 20, 21, 22, 25, 26, 27 and 28 of the present invention.

Referring to FIG. 35, the epitaxial silicon layers 10 are formed through a step similar to that in the embodiment 15. At this time, silicon fragments 10a are formed on side walls 9.

Figure 36:
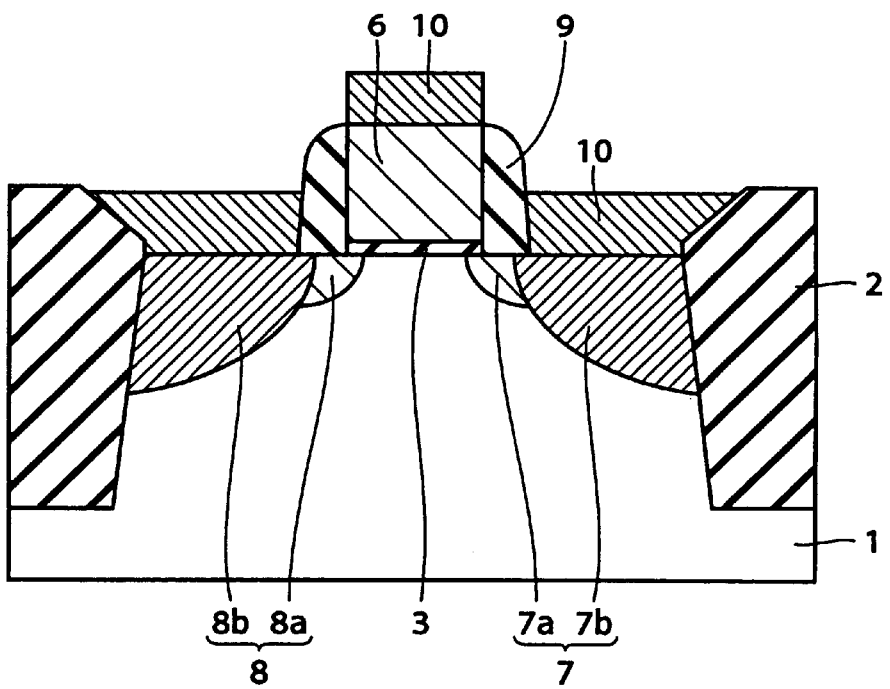
FIG. 36 is a sectional view showing a step of removing silicon fragments 10*a* in the method of fabricating a field-effect transistor according to each of the embodiments 20, 21, 22, 25, 26, 27 and 28 of the present invention.

Referring to FIG. 36, the silicon substrate 1 is then dipped in a mixed solution of hydrofluoric acid and nitric acid. At this time, the etching rate for the silicon fragments 10a, having larger surface areas exposed to the mixed solution as compared with the epitaxial silicon layers 10, is faster. Further, the mean thickness of the silicon fragments 10a formed on the side walls 9 is smaller than that of the epitaxial silicon layers 10.

Therefore, the epitaxial silicon layers 10 can be left after dissolving all silicon fragments 10a in the mixed solution by setting a prescribed dipping time. The dipping time is varied with the temperature and concentration of the mixed solution. For example, the dipping time for a mixed solution containing hydrofluoric acid, nitric acid and water in the ratios of 1:60:60 is about 1 second to 100 seconds.

Thereafter a field-effect transistor is completed through steps similar to those in the embodiment 15 shown in FIGS. 27 to 30.

In the aforementioned method of fabricating a field-effect transistor according to the embodiment 20, the silicon fragments 10a are so removed that upper portions of the side walls 9 can be prevented from formation of excess salicide layers in a later step of forming salicide, similarly to the embodiment 6.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

[Embodiment 21]

The method of fabricating a field-effect transistor according to the embodiment 21 is described with reference to FIGS. 35 and 36, similarly to the embodiment 20. Steps up to that for forming epitaxial silicon layers 10 on a source region 7 and a drain region 8 are identical to those of the embodiment 15 described with reference to FIGS. 23 to 25, and hence redundant description is omitted.

A silicon substrate 1 is prepared from that having a major surface oriented in the (111) direction. This embodiment corresponds to the method of fabricating a field-effect transistor according to the embodiment 7, except the structure of a gate electrode.

Referring to FIG. 35, the epitaxial silicon layers 10 are formed through a step similar to that in the embodiment 15. At this time, silicon fragments 10a are formed on side walls 9. The silicon fragments 10a have no such orientation as that of the silicon substrate 1.

Referring to FIG. 36, the silicon substrate 1 is dipped in a solution of potassium hydroxide (KOH). The time for dipping the silicon substrate 1 in the KOH solution of 5 moles/l is about 1 second to 100 seconds.

The KOH solution, known as a selective etching solution for silicon, has a slow etching rate for the (111) plane. The etching rate for the silicon fragments 10a with the KOH solution is remarkably higher than that for the silicon epitaxial layers 10 due to the difference in crystal orientation between the silicon epitaxial layers 10 and the silicon fragments 10a.

Further, the etching rate for the silicon fragments 10a, having larger surface areas exposed to the KOH solution as compared with the epitaxial silicon layers 10, is increased. In addition, the mean thickness of the silicon fragments 10a formed on the side walls 9 is smaller than that of the epitaxial silicon layers 10.

Therefore, the silicon fragments 10a can be completely removed by setting a dipping time for sufficiently leaving the epitaxial silicon layers 10. The dipping time is varied with the temperature and concentration of the KOH solution. Thereafter a field-effect transistor is completed through steps similar to those in the embodiment 15 shown in FIGS. 27 to 30.

In the aforementioned method of fabricating a field-effect transistor according to the embodiment 21, the silicon fragments 10a are so removed that upper portions of the side walls 9 can be prevented from formation of excess salicide layers in a later step of forming salicide, similarly to the embodiment 6.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

[Embodiment 22]

The method of fabricating a field-effect transistor according to the embodiment 22 is described with reference to FIGS. 35 and 36, similarly to the embodiments 20 and 21. Steps up to that for forming epitaxial silicon layers 10 on a source region 7 and a drain region 8 are identical to those of the embodiment 15 described with reference to FIGS. 23 to 25, and hence redundant description is omitted. This embodiment corresponds to the method of fabricating a field-effect transistor according to the embodiment 8, except the structure of a gate electrode.

Referring to FIG. 35, the epitaxial silicon layers 10 are formed through a step similar to that in the embodiment 15. At this time, silicon fragments 10a are formed on side walls 9.

Referring to FIG. 36, a silicon substrate 1 is exposed to a plasma atmosphere of fluorine and oxygen. At this time, no electric field is applied between the silicon substrate 1 and the plasma. Thus, the silicon fragments 10a can be isotropically etched through chemical reaction with the plasma of fluorine.

The etching rate for the silicon fragments 10a, having larger surface areas exposed to the plasma as compared with the epitaxial silicon layers 10, is increased. Further, the mean thickness of the silicon fragments 10a formed on the side walls 9 is smaller than that of the epitaxial silicon layers 10.

Therefore, the silicon fragments 10a can be completely removed by setting etching conditions for sufficiently leaving the epitaxial silicon layers 10 after etching all silicon fragments 10a. Thereafter a field-effect transistor is completed through steps similar to those in the embodiment 15 shown in FIGS. 27 to 30.

In the aforementioned method of fabricating a field-effect transistor according to the embodiment 22, the silicon fragments 10a are so removed that upper portions of the side walls 9 can be prevented from formation of excess salicide layers in a later step of forming salicide, similarly to the embodiment 8.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

While fluorine is employed as halogen gas in this embodiment, a similar effect can be attained by employing chlorine, bromine, iodine or astatine in place of fluorine.

[Embodiment 23]

The method of fabricating a field-effect transistor according to the embodiment 23 is described with reference to FIGS. 37 to 41. Steps up to that for forming epitaxial silicon layers 10 on a source region 7 and a drain region 8 are identical to those of the embodiment 15 described with reference to FIGS. 23 to 25, and hence redundant description is omitted. This embodiment corresponds to the method of fabricating a field-effect transistor according to the embodiment 9, except the structure of a gate electrode.

Figure 37:
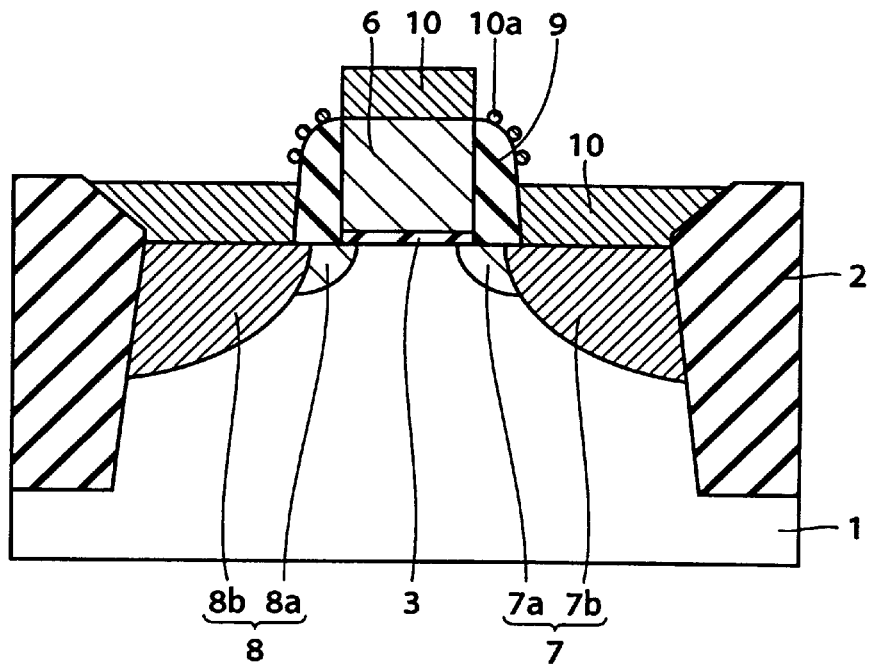
FIG. 37 is a sectional view showing a step of forming epitaxial silicon layers 10 in a method of fabricating a field-effect transistor according to an embodiment 23 of the present invention.

Referring to FIG. 37, the epitaxial silicon layers 10 are formed through a step similar to that in the embodiment 15. At this time, silicon fragments 10a are formed on side walls 9.

Figure 38:
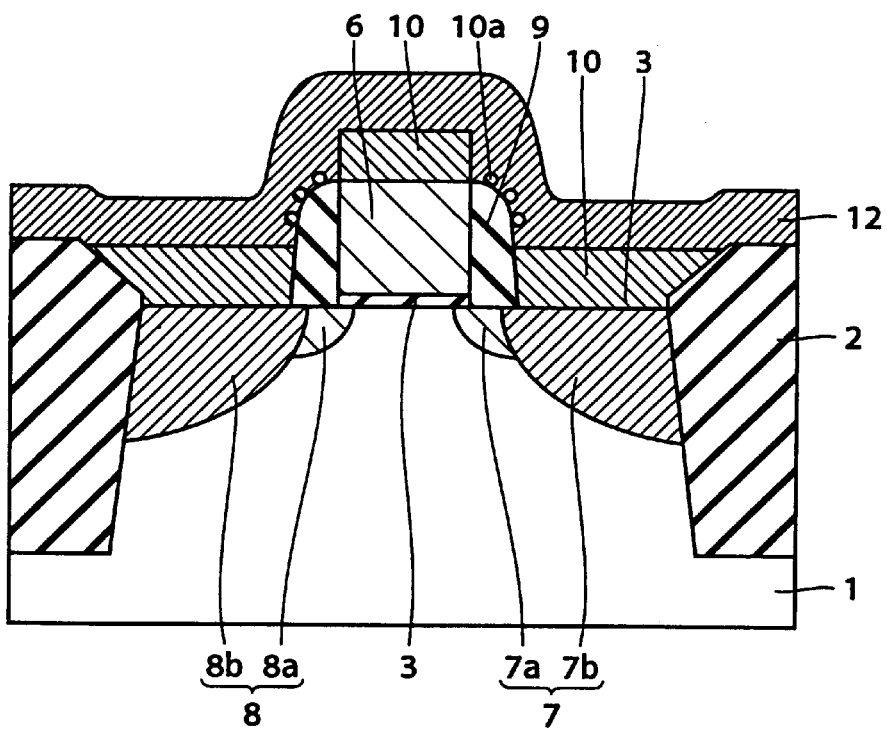
FIG. 38 is a sectional view showing a step of forming a metal thin film 12 in the method of fabricating a field-effect transistor according to the embodiment 23 of the present invention.
Figure 39:
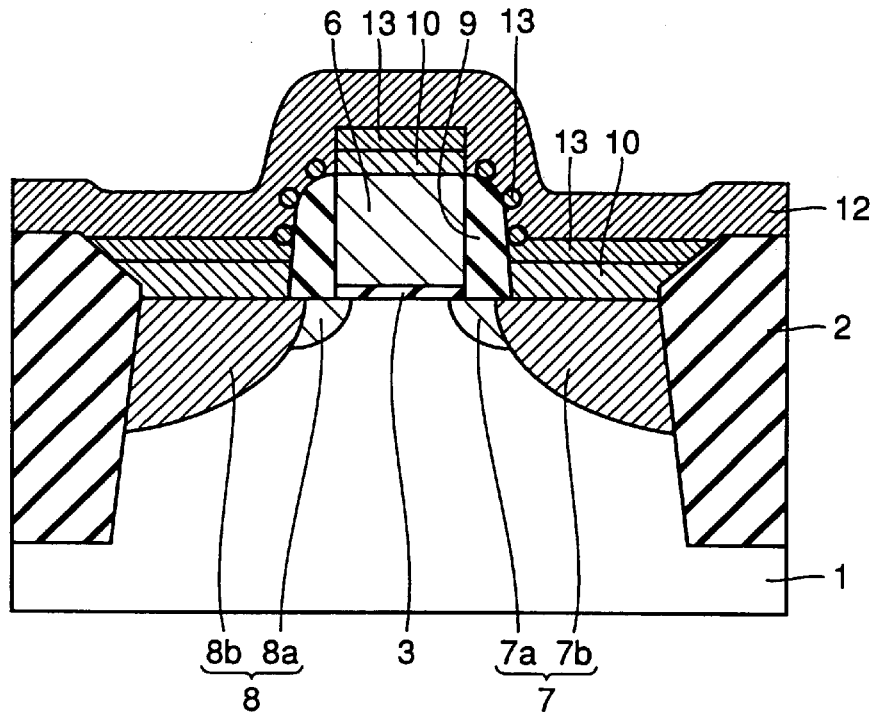
FIG. 39 is a sectional view showing a step of forming titanium silicide layers 13 in the method of fabricating a field-effect transistor according to the embodiment 23 of the present invention.

Referring to FIG. 38, a titanium film 12 is deposited by sputtering. The thickness of the titanium film 12 is 50 Å to 3000 Å. Referring to FIG. 39, a silicon substrate 1 including the titanium film 12 is heat-treated in a nitrogen atmosphere at 500° C. to 900° C. for 10 seconds to 300 seconds. Thus, titanium silicide layers 13 are formed on the interface between the silicon substrate 1 and the titanium film 12.

Figure 40:
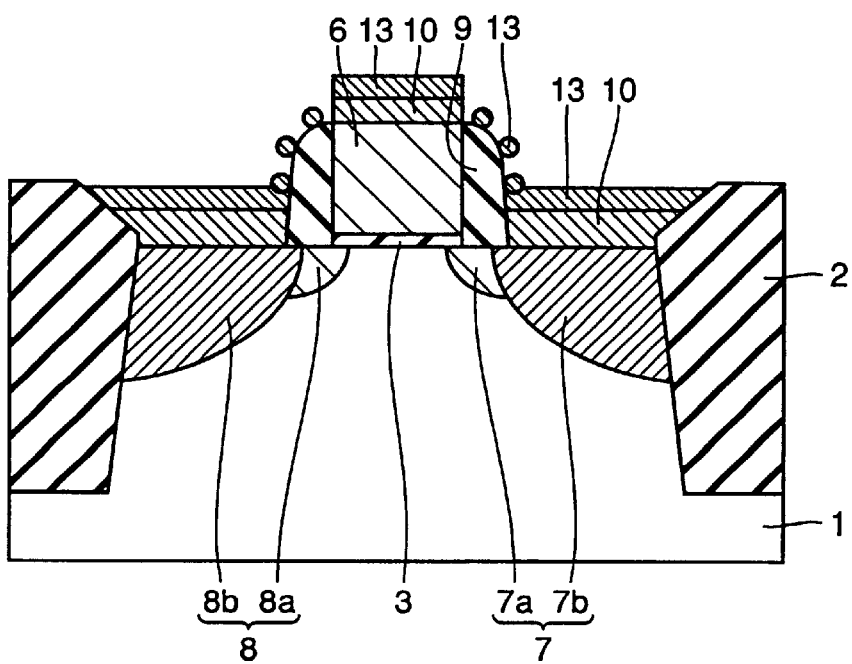
FIG. 40 is a sectional view showing a step of removing an unreacted part of the metal thin film 12 in the method of fabricating a field-effect transistor according to the embodiment 23 of the present invention.

Referring to FIG. 40, the silicon substrate 1 is dipped in a mixed solution containing sulfuric acid and hydrogen peroxide in the ratio of 4:1. Thus, the unreacted part of the titanium film 12 is removed.

Figure 41:
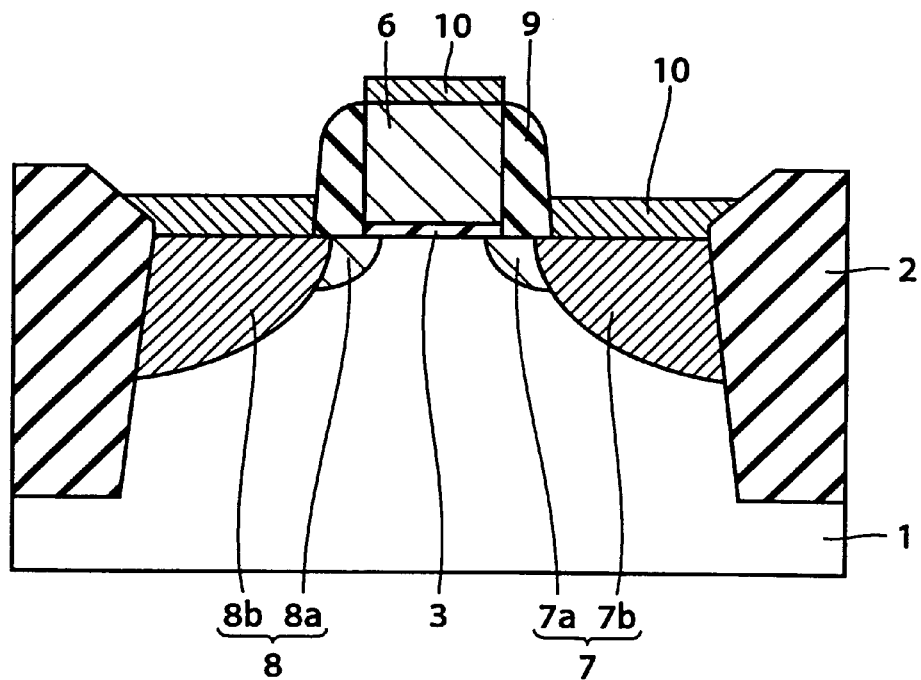
FIG. 41 is a sectional view showing a step of removing the titanium silicide layers 13 in the method of fabricating a field-effect transistor according to the embodiment 23 of the present invention.

Referring to FIG. 41, the titanium silicide layers 13 formed on the silicon substrate 1 are removed with hydrofluoric acid. Thereafter a field-effect transistor is completed through steps similar to those in the embodiment 15 shown in FIGS. 19 to 22.

In the method of fabricating a field-effect transistor according to the embodiment 23, the titanium film 12 and the epitaxial silicon layers 10 cause silicide reaction to form the titanium silicide layers 13, similarly to the embodiment 9. Then, the titanium silicide layers 13 are removed by dipping the silicon substrate 1 in the mixed solution of sulfuric acid and hydrogen peroxide. Thus, upper portions of the side walls 9 can be prevented from formation of excess salicide layers in a later step of forming salicide.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

While titanium is employed in this embodiment, a similar function/effect can be attained by employing hafnium, zirconium or cobalt in place of titanium.

[Embodiment 24]

The method of fabricating a field-effect transistor according to the embodiment 24 is described with reference to FIGS. 42 to 44. In this embodiment, the amount of silicon fragments 10a formed on side walls 9 is smaller than that in the embodiment 23. Steps up to that for forming epitaxial silicon layers 10 on a source region 7 and a drain region 8 are identical to those of the embodiment 15 described with reference to FIGS. 23 to 25, and hence redundant description is omitted.

Figure 42:
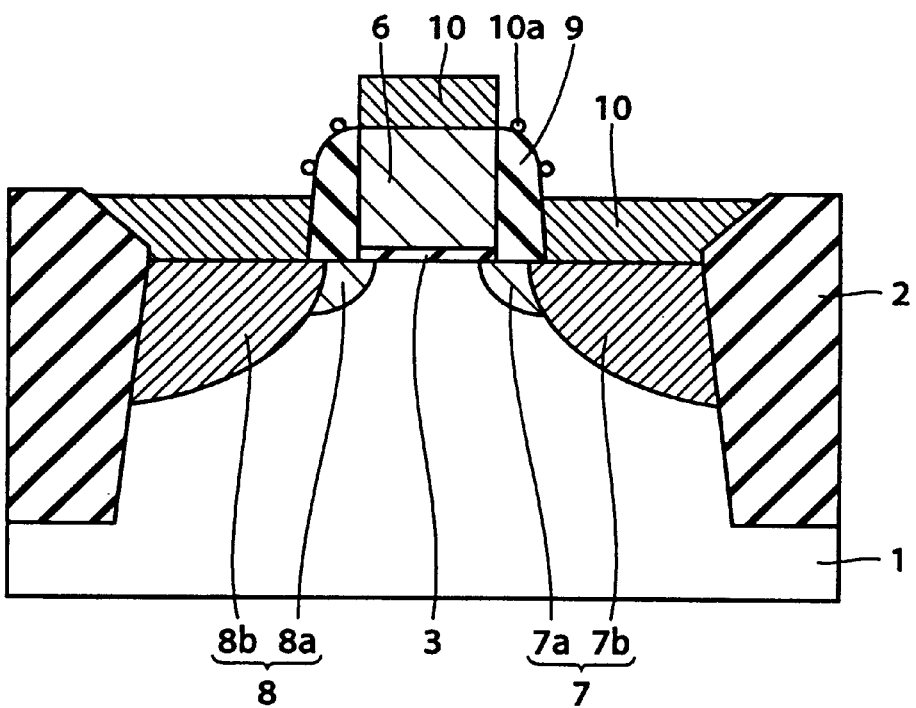
FIG. 42 is a sectional view showing a step of forming epitaxial silicon layers 10 in the method of fabricating a field-effect transistor according to the embodiment 24 of the present invention.

Referring to FIG. 42, the epitaxial silicon layers 10 are formed through a step similar to that in the embodiment 15. At this time, the silicon fragments 10a are formed on the side walls 9. The amount of the silicon fragments 10a is smaller than that in the embodiment 9.

Figure 43:
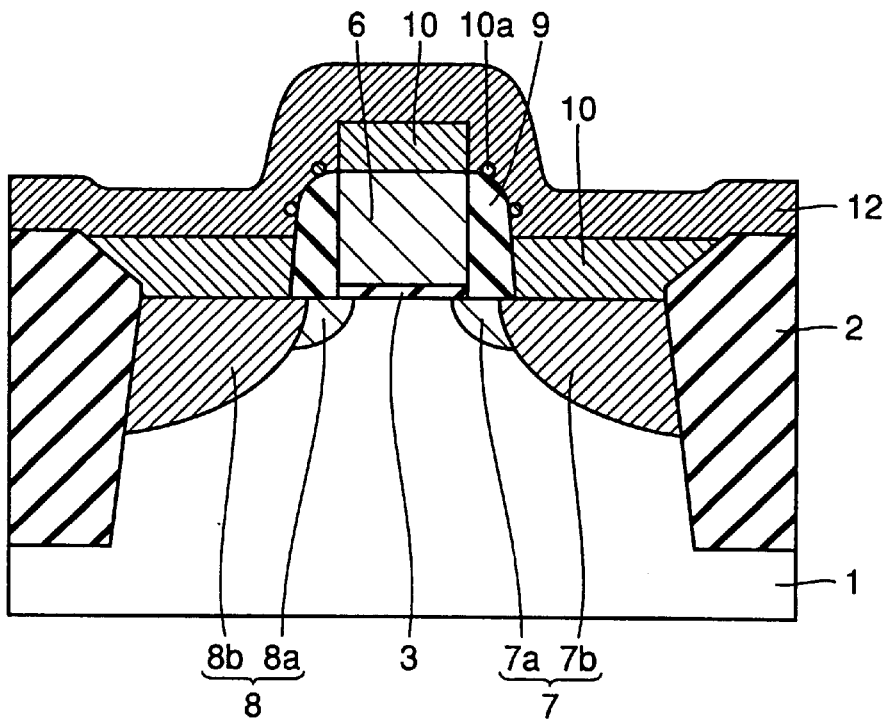
FIG. 43 is a sectional view showing a step of forming a metal thin film 12 in the method of fabricating a field-effect transistor according to the embodiment 24 of the present invention.
Figure 44:
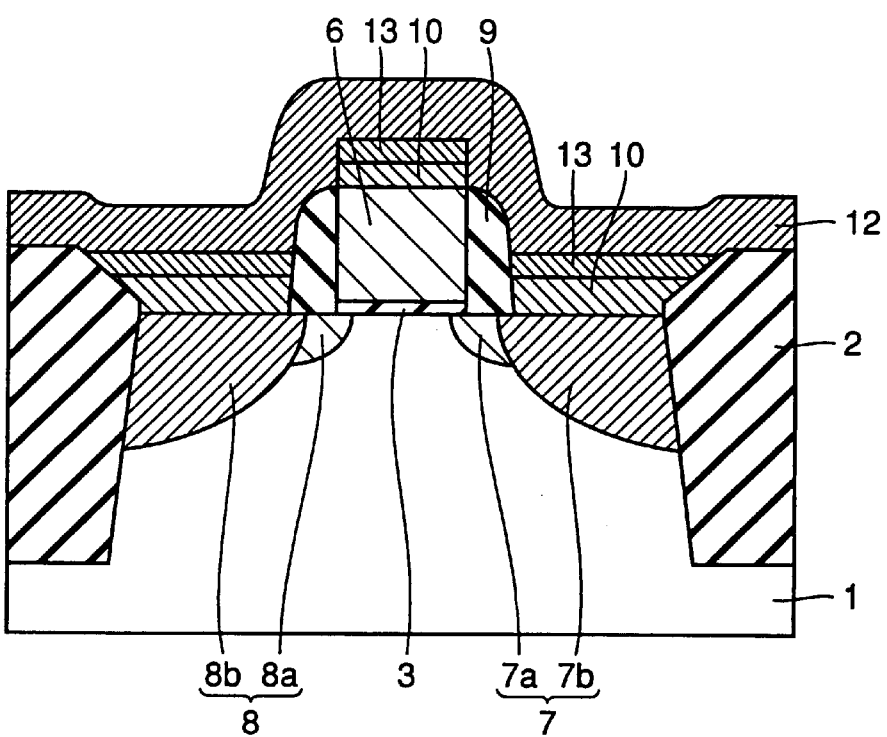
FIG. 44 is a sectional view showing a step of forming titanium silicide layers 13 in the method of fabricating a field-effect transistor according to the embodiment 24 of the present invention.
Figure 45:
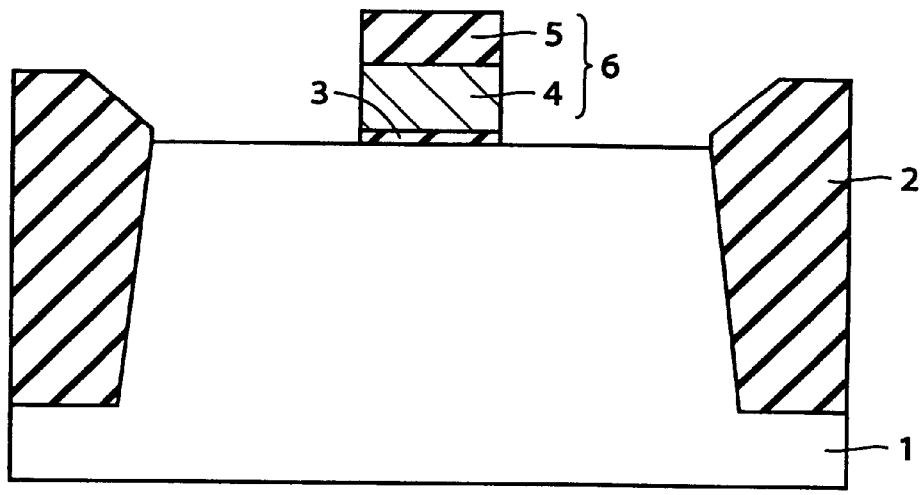
FIG. 45 is a sectional view showing a step of forming a gate electrode 6 in a first conventional method of fabricating a field-effect transistor.
Figure 46:
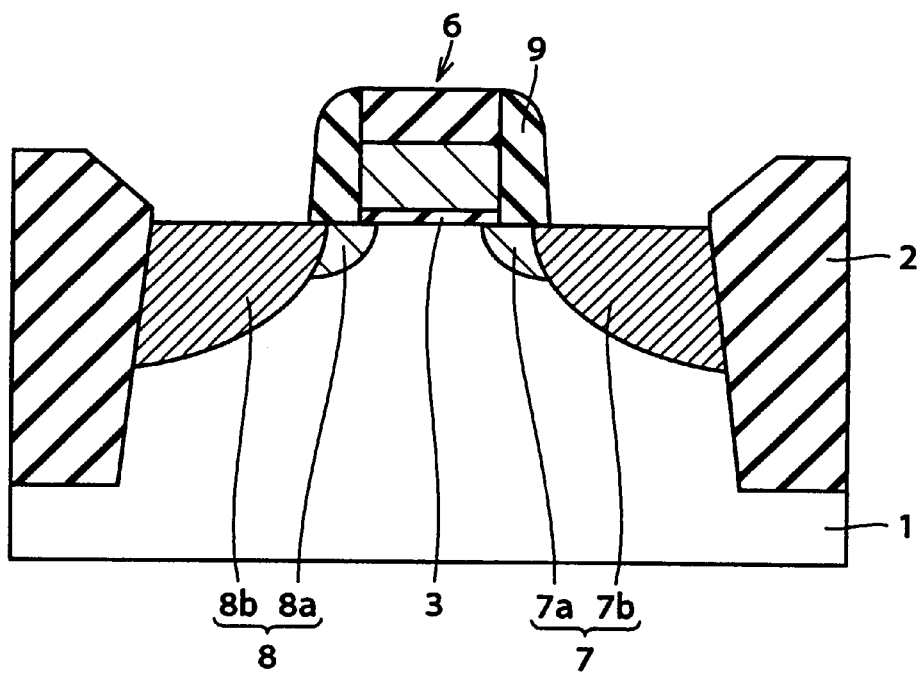
FIG. 46 is a sectional view showing a step of forming source/drain regions 7 and 8 in the first conventional method of fabricating a field-effect transistor.
Figure 47:
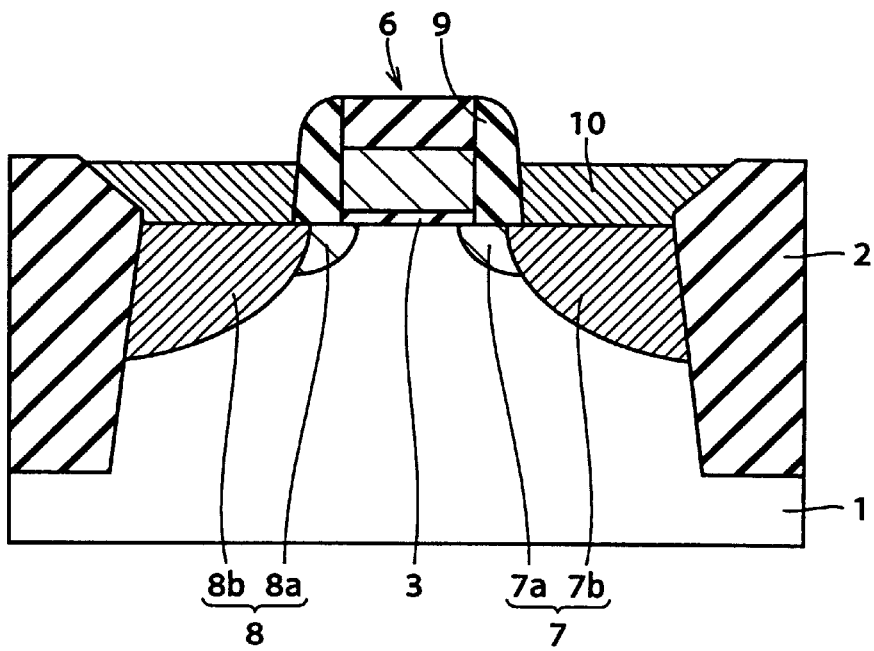
FIG. 47 is a sectional view showing a step of forming epitaxial silicon layers 10 in the first conventional method of fabricating a field-effect transistor.
Figure 48:
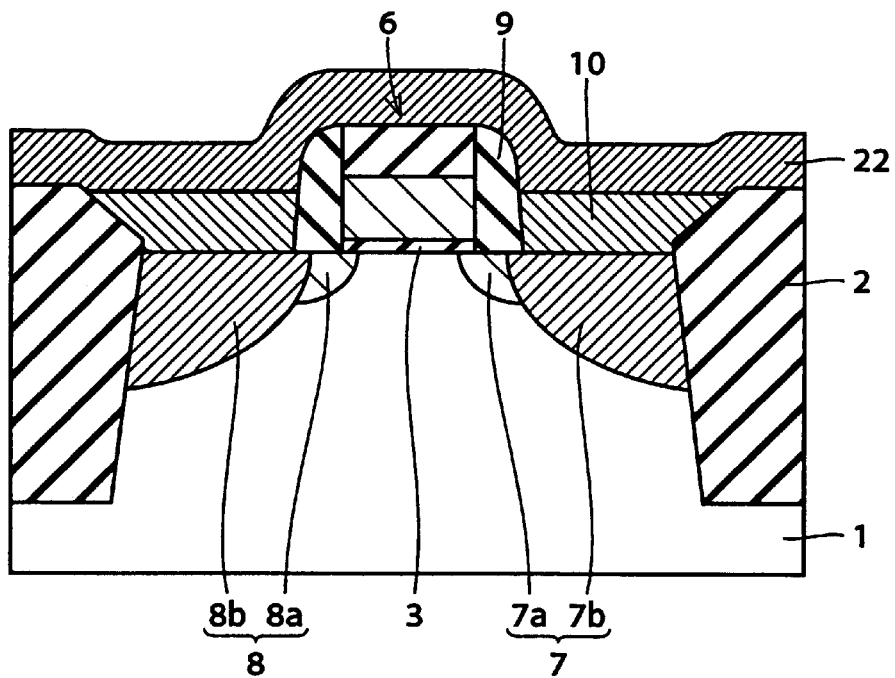
FIG. 48 is a sectional view showing a step of forming a metal thin film 22 in the first conventional method of fabricating a field-effect transistor.
Figure 49:
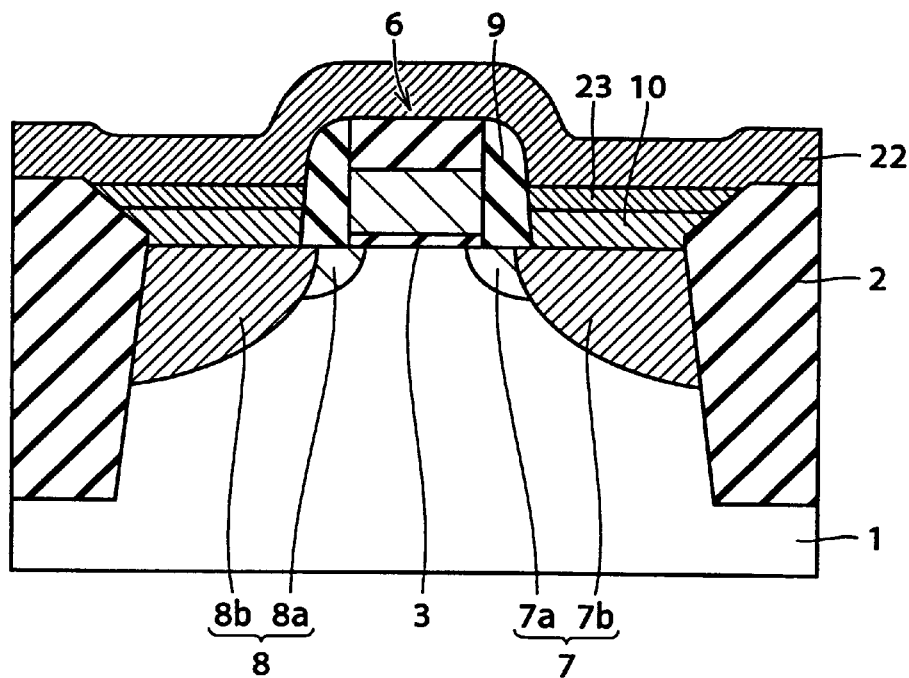
FIG. 49 is a sectional view showing a step of forming titanium silicide layers 13 in the first conventional method of fabricating a field-effect transistor.
Figure 50:
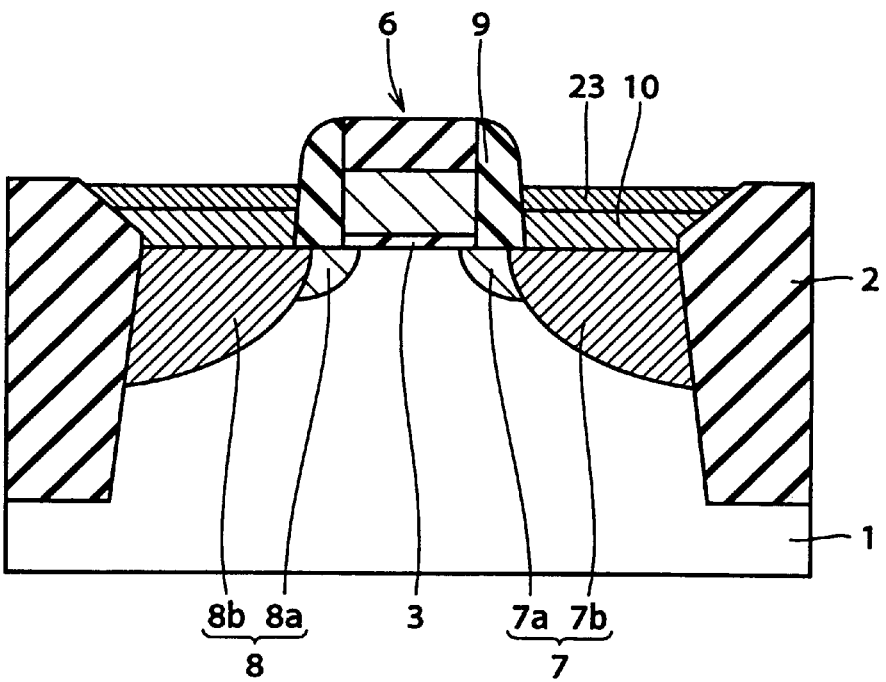
FIG. 50 is a sectional view showing a step of removing an unreacted part of the metal thin film 22 in the first conventional method of fabricating a field-effect transistor.
Figure 51:
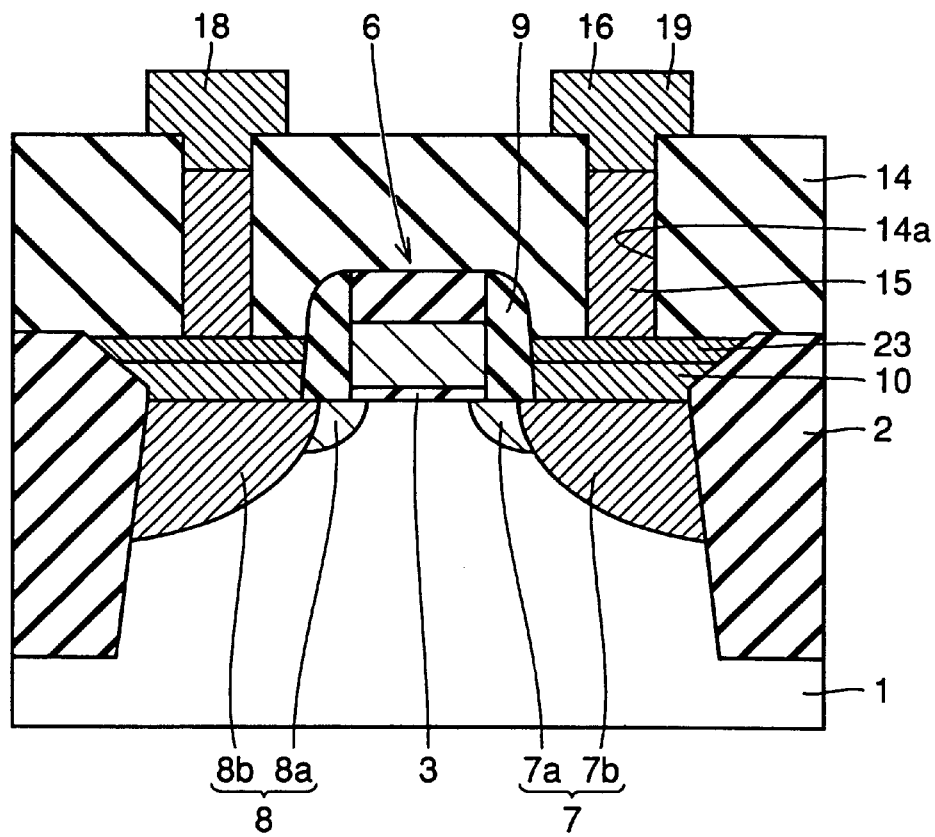
FIG. 51 is a sectional view showing a step of forming a source electrode 18 and a drain electrode 19 in the first conventional method of fabricating a field-effect transistor.
Figure 52:
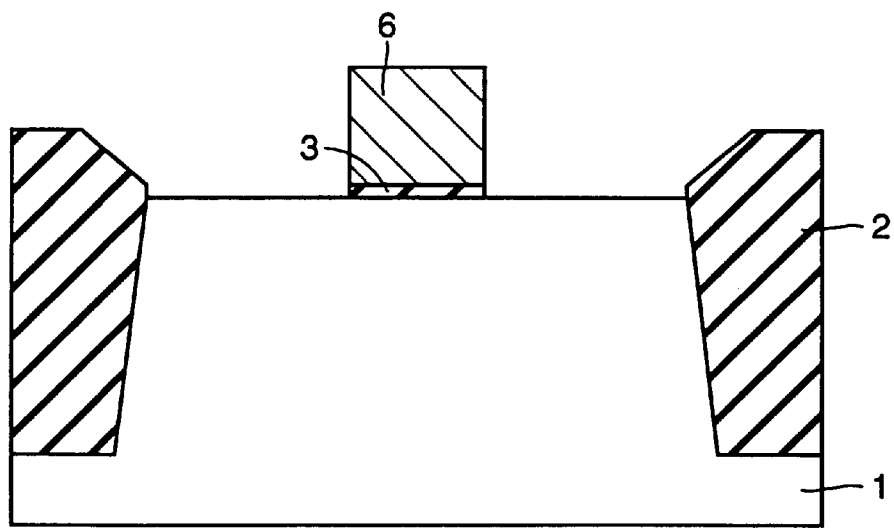
FIG. 52 is a sectional view showing a step of forming a gate electrode 6 in a second conventional method of fabricating a field-effect transistor.
Figure 53:
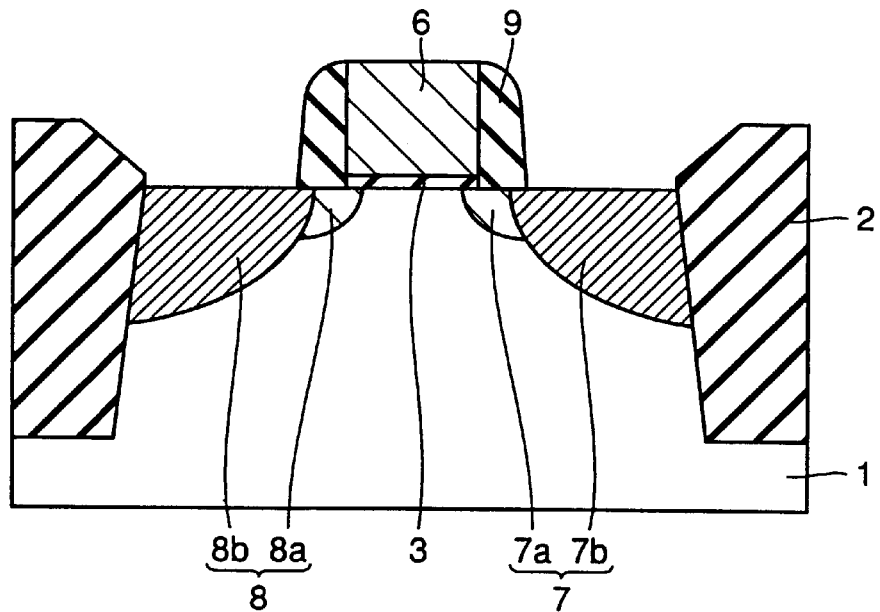
FIG. 53 is a sectional view showing a step of forming source/drain regions 7 and 8 in the second conventional method of fabricating a field-effect transistor.
Figure 54:
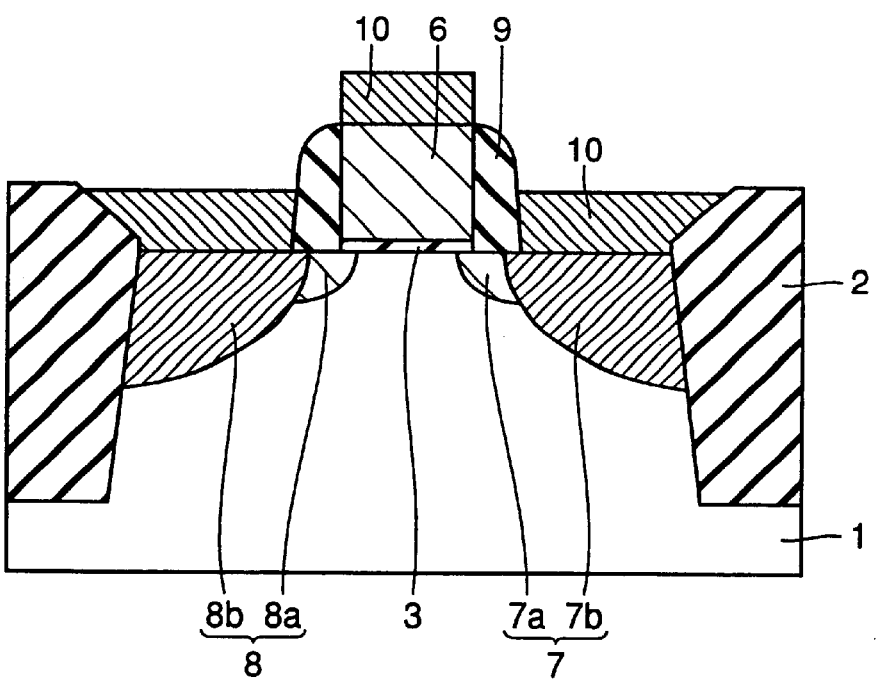
FIG. 54 is a sectional view showing a step of forming epitaxial silicon layers 10 in the second conventional method of fabricating a field-effect transistor.
Figure 55:
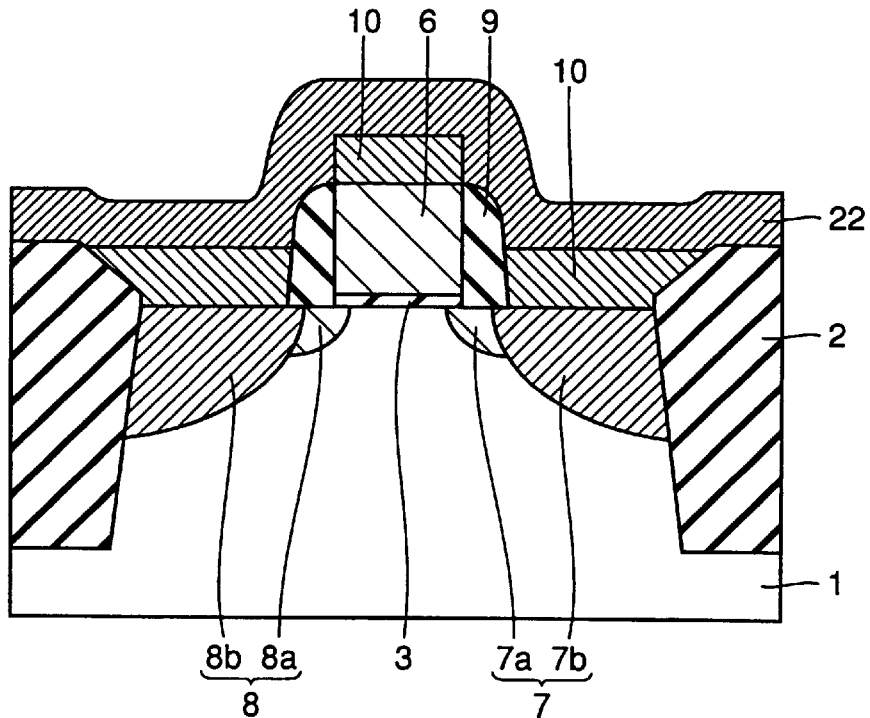
FIG. 55 is a sectional view showing a step of forming a metal thin film 22 in the second conventional method of fabricating a field-effect transistor.
Figure 56:
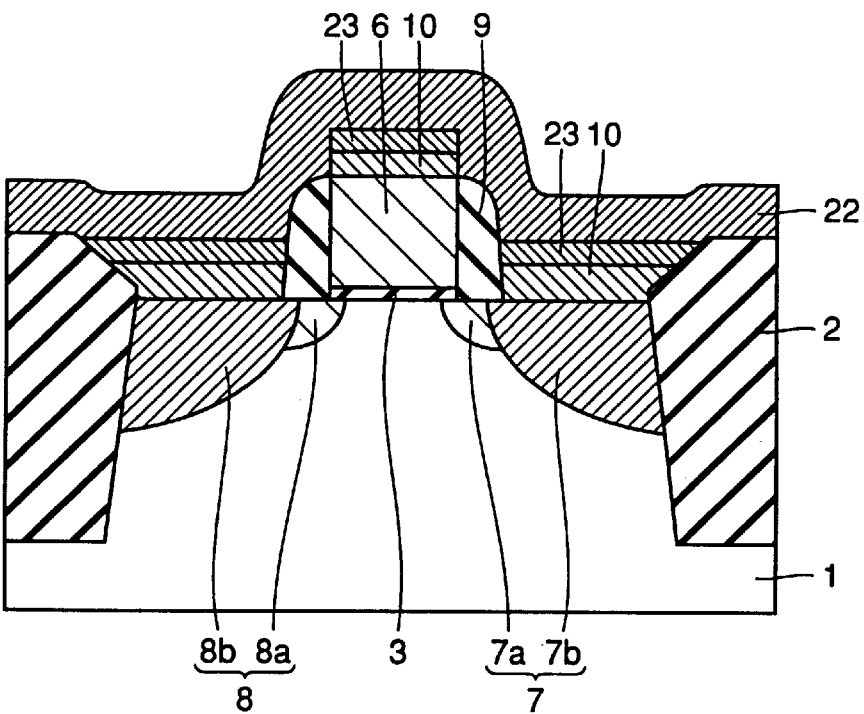
FIG. 56 is a sectional view showing a step of forming titanium silicide layers 13 in the second conventional method of fabricating a field-effect transistor.
Figure 57:
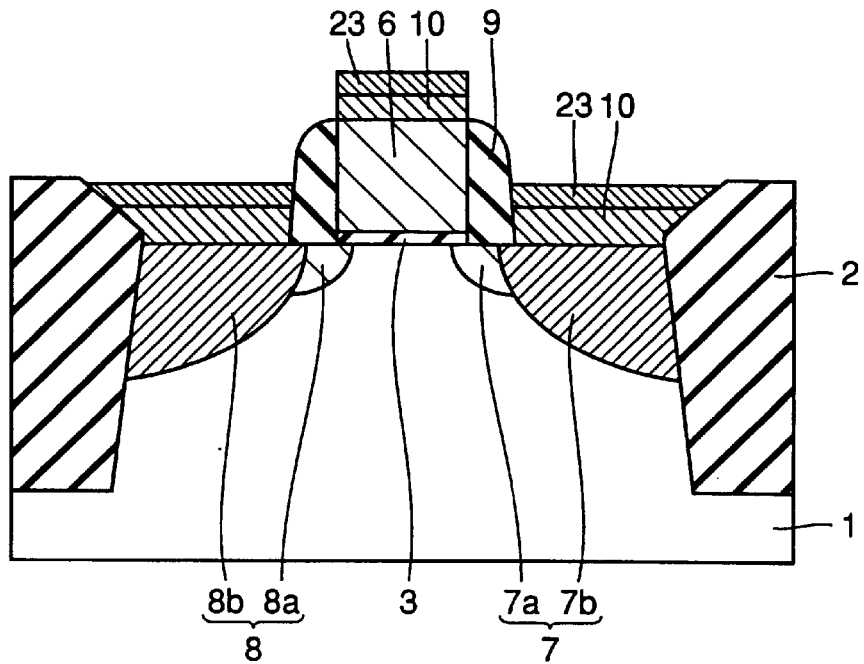
FIG. 57 is a sectional view showing a step of removing an unreacted part of the metal thin film 22 in the second conventional method of fabricating a field-effect transistor.
Figure 58:
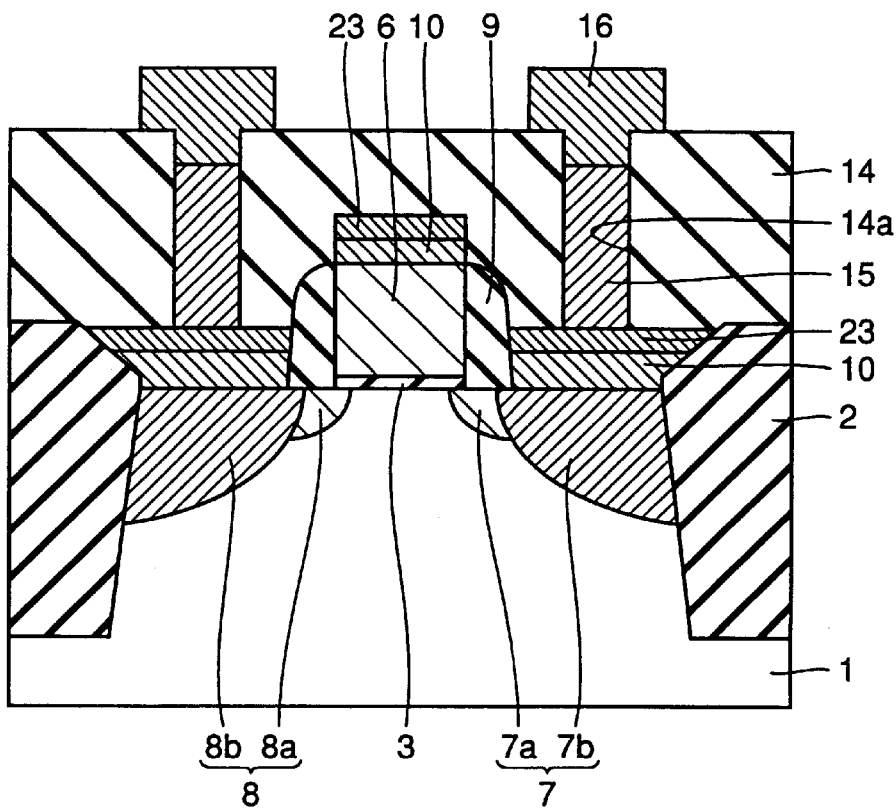
FIG. 58 is a sectional view showing a step of forming a source electrode 18 and a drain electrode 19 in the second conventional method of fabricating a field-effect transistor.
Figure 59:
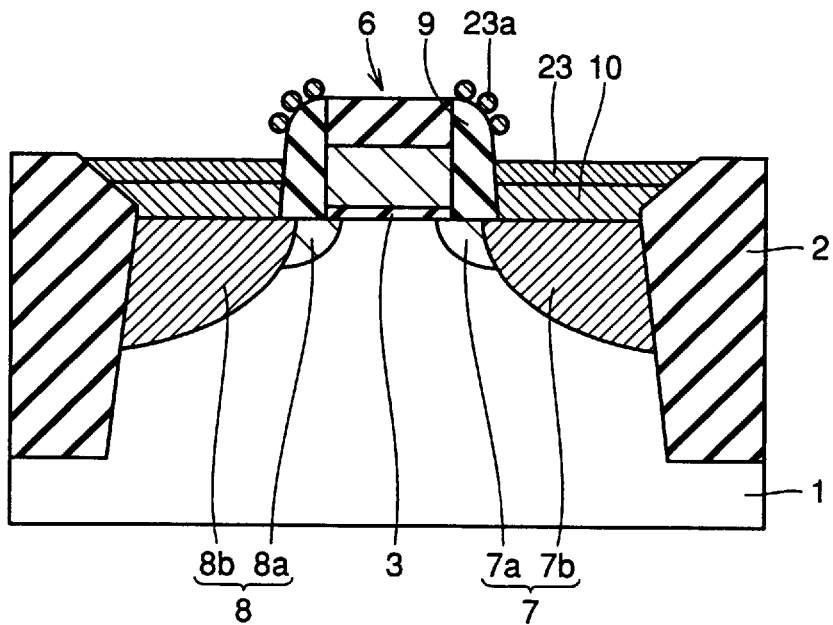
FIG. 59 is a sectional view for illustrating a problem in the first conventional method of fabricating a field-effect transistor.
Figure 60:
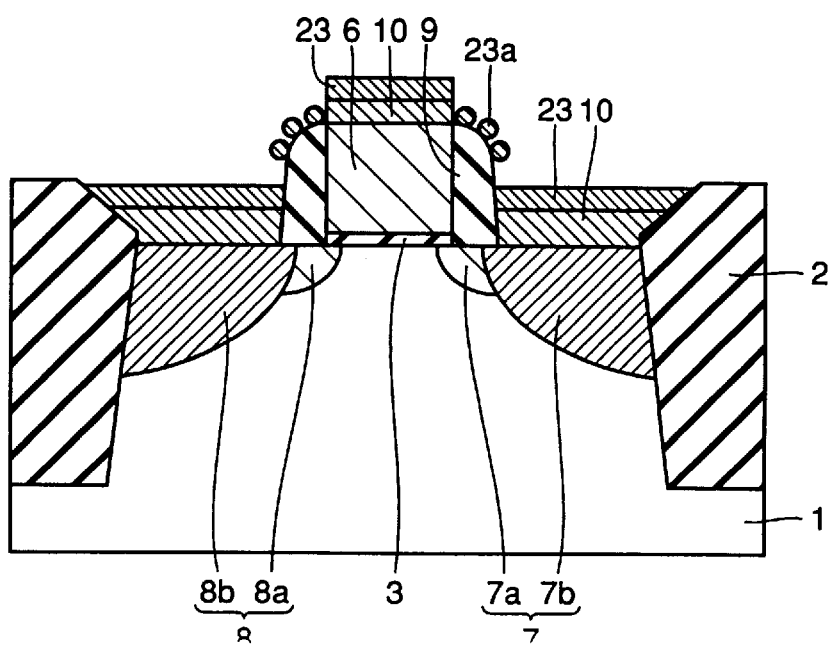
FIG. 60 is a sectional view for illustrating a problem in the second conventional method of fabricating a field-effect transistor.

Referring to FIG. 43, a titanium film 12 is thereafter deposited by sputtering. The thickness of the titanium film 12 is 50 Å to 3000 Å, similarly to the embodiment 9. Referring to FIG. 44, a silicon substrate 1 including the titanium film 12 is heat-treated in a nitrogen atmosphere at 500° C. to 900° C. for 10 seconds to 300 seconds.

Thus, titanium silicide layers 13 are formed on the interface between the silicon substrate 1 and the titanium film 12. The silicon fragments 10a provided in a sufficiently small amount are diffused in the titanium film 12 to disappear. Thereafter the silicon substrate 1 is dipped in a mixed solution of sulfuric acid and hydrogen peroxide, similarly to the embodiment 23 (see FIG. 40). The mixed solution contains sulfuric acid and hydrogen peroxide in the ratio of 4:1. Thus, the unreacted part of the titanium film 12 is removed. Thereafter a field-effect transistor is completed through steps similar to those in the embodiment 15 shown in FIGS. 27 to 30.

In the method of fabricating a field-effect transistor according to the embodiment 24, the titanium film 12 and the epitaxial silicon layers 10 cause silicide reaction to form the titanium silicide layers 13.

Then, the titanium silicide layers 13 formed on the epitaxial silicon layers 10 are removed by dipping the silicon substrate 1 in the mixed solution of sulfuric acid and hydrogen peroxide. Thus, upper portions of the side walls 9 can be prevented from formation of excess salicide layers in a later step of forming salicide.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

While titanium is employed in this embodiment, a similar function/effect can be attained by employing hafnium, zirconium or cobalt in place of titanium, similarly to the embodiment 9.

[Embodiment 25]

The method of fabricating a field-effect transistor according to the embodiment 25 is described with reference to FIGS. 35 and 36, similarly to the embodiments 20, 21 and 22. Steps up to that for forming epitaxial silicon layers 10 on a source region 7 and a drain region 8 are identical to those of the embodiment 15 described with reference to FIGS. 23 to 25, and hence redundant description is omitted. This embodiment corresponds to the method of fabricating a field-effect transistor according to the embodiment 11, except the structure of a gate electrode.

Referring to FIG. 35, the epitaxial silicon layers 10 are formed through a step similar to that in the embodiment 15. At this time, silicon fragments 10a are formed on the side walls 9.

Referring to FIG. 36, surfaces are polished with polishing cloth. At this time, the silicon fragments 10a are scraped off by the polishing. The silicon fragments 10a adhering to the side walls 9 have smaller adhesiveness than the epitaxial silicon layers 10. Thus, the silicon fragments 10a can be completely removed by setting the polishing conditions for not appreciably removing the epitaxial silicon layers 10 while removing the silicon fragments 10a formed on the side walls 9. A polishing solution prepared by adding colloidal silica or fumed silica to an organic amine solvent, a KOH solvent or an organic ammonia solvent is also employable.

Then, a field-effect transistor is completed through steps similar to those in the embodiment 15 shown in FIGS. 27 to 30.

In the method of fabricating a field-effect transistor according to the embodiment 25, the silicon fragments 10 are so removed that upper portions of the side walls 9 can be prevented from formation of excess salicide layers in a later step of forming salicide, similarly to the embodiment 11.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

While the surfaces are polished with the polishing cloth in this embodiment, a similar effect can be attained by polishing the surfaces with a brush or the like, as a matter of course.

[Embodiment 26]

The method of fabricating a field-effect transistor according to the embodiment 26 is described with reference to FIGS. 35 and 36, similarly to the embodiments 20, 21, 22 and 25. Steps up to that for forming epitaxial silicon layers 10 on a source region 7 and a drain region 8 are identical to those of the embodiment 15 described with reference to FIGS. 23 to 25, and hence redundant description is omitted. This embodiment corresponds to the method of fabricating a field-effect transistor according to the embodiment 12, except the structure of a gate electrode.

Referring to FIG. 35, the epitaxial silicon layers 10 are formed through a step similar to that in the embodiment 15. At this time, silicon fragments 10a are formed on the side walls 9.

Referring to FIG. 36, frozen water is collided with a surface of a silicon substrate 1 at a high speed. The silicon fragments 10a are scraped off due to this bombardment. The silicon fragments 10a adhering to the side walls 9 have smaller adhesiveness than the epitaxial silicon layers 10.

Thus, the silicon fragments 10a can be completely removed by setting the conditions for colliding the frozen water with the silicon substrate 1 for not appreciably removing the epitaxial silicon layers 10 while removing the silicon fragments 10a formed on the side walls 9. When the frozen water is formed by grains of 50 μm in thickness, the speed of the grains is set at 100 m/s to 340 m/s.

Then, a field-effect transistor is completed through steps similar to those in the embodiment 15 shown in FIGS. 27 to 30.

In the method of fabricating a field-effect transistor according to the embodiment 26, the silicon fragments 10a are so removed that upper portions of the side walls 9 can be prevented from formation of excess salicide layers in a later step of forming salicide, similarly to the embodiment 12.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

While the frozen water is employed in this embodiment, a similar effect is attained by employing particulates prepared by freezing an organic solvent such as alcohol, those prepared by freezing rare gas such as neon, argon or krypton, or those forming a solid under the normal temperature such as grains of quartz.

[Embodiment 27]

The method of fabricating a field-effect transistor according to the embodiment 27 is described with reference to FIGS. 35 and 36, similarly to the embodiments 20, 21, 22, 23 and 26. Steps up to that for forming epitaxial silicon layers 10 on a source region 7 and a drain region 8 are identical to those of the embodiment 15 described with reference to FIGS. 23 to 25, and hence redundant description is omitted. This embodiment corresponds to the method of fabricating a field-effect transistor according to the embodiment 13, except the structure of a gate electrode.

Referring to FIG. 35, the epitaxial silicon layers 10 are formed through a step similar to that in the embodiment 15. At this time, silicon fragments 10a are formed on the side walls 9.

Referring to FIG. 36, ultrasonic waves are applied to a surface of a silicon substrate 1 through pure water while sprinkling the surface with the pure water. The silicon fragments 10a are removed due to action of the ultrasonic waves. The silicon fragments 10a adhering to the side walls 9 have smaller adhesiveness than the epitaxial silicon layers 10.

Thus, the silicon fragments 10a formed on the side walls 9 can be completely removed while not appreciably removing the epitaxial silicon layers 10.

Then, a field-effect transistor is completed through steps similar to those in the embodiment 15 shown in FIGS. 27 to 30.

In the method of fabricating a field-effect transistor according to the embodiment 27, the silicon fragments 10a are so removed that upper portions of the side walls 9 can be prevented from formation of excess salicide layers in a later step of forming salicide, similarly to the embodiment 13.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

[Embodiment 28]

The method of fabricating a field-effect transistor according to the embodiment 28 is described with reference to FIGS. 35 and 36, similarly to the embodiments 20, 21, 22, 23, 24 and 27. Steps up to that for forming epitaxial silicon layers 10 on a source region 7 and a drain region 8 are identical to those of the embodiment 15 described with reference to FIGS. 23 to 25, and hence redundant description is omitted. This embodiment corresponds to the method of fabricating a field-effect transistor according to the embodiment 14, except the structure of a gate electrode.

Referring to FIG. 35, the epitaxial silicon layers 10 are formed through a step similar to that in the embodiment 15. At this time, silicon fragments 10a are formed on side walls 9.

Referring to FIG. 36, a surface of a silicon substrate 1 is exposed to chlorine gas. At this time, the silicon fragments 10a are removed due to etching action of the chlorine gas. The etching rate for the silicon fragments 10a, having larger surface areas exposed to the halogen gas as compared with the epitaxial silicon layers 10, is increased. Further, the mean thickness of the silicon fragments 10a formed on the side walls 9 is smaller than that of the epitaxial silicon layers 10.

Therefore, the silicon fragments 10a can be removed while not appreciably etching the silicon epitaxial layers 10. The pressure of the chlorine gas is set at $1\times10^{-4}$ Torr to $1\times10^{-7}$ Torr.

Then, a field-effect transistor is completed through steps similar to those in the embodiment 15 shown in FIGS. 27 to 30.

In the method of fabricating a field-effect transistor according to the embodiment 28, the silicon fragments 10a are so removed that upper portions of the side walls 9 can be prevented from formation of excess salicide layers in a later step of forming salicide, similarly to the embodiment 14.

Consequently, isolation between a source electrode 18 and a drain electrode 19 is improved and a field-effect transistor having high electrical reliability can be formed. Further, the possibility of removing the silicon fragments 10a with no heat treatment is advantageous for formation of a shallow junction.

The silicon fragments 10a can be more effectively removed by combining the method of fabricating a field-effect transistor according to each of the embodiments 20 to 28 with that according to each of the embodiments 15 to 19.

While each of the aforementioned embodiments has been described with reference to an nMOS field-effect transistor formed by introducing an n-type impurity into source/drain regions, a similar function/effect can be attained also when the present invention is applied to a PMOS field-effect transistor formed by introducing a p-type impurity into source/drain regions.

In the method of fabricating a semiconductor device according to the present invention, semiconductor crystals adhering to upper portions of side walls provided between source/drain regions and a gate electrode of a MOS transistor are oxidized or removed through an isolation step and the MOS transistor is prevented from shorting of a source electrode, a drain electrode and the gate electrode thereof. Consequently, a semiconductor device having excellent electrical reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device comprising the sequential steps of:

forming an element forming region electrically isolated by an element isolation film on a major surface of a semiconductor substrate;

forming a gate electrode on said element forming region;

forming a source region on one of two areas of said element forming region divided by said gate electrode while forming a drain region on remaining said area, and forming side walls consisting of insulator films on side surfaces of said gate electrode;

selectively growing semiconductor thin films on surfaces of said source region and said drain region leaving semiconductor fragments on surfaces of said side walls; and an isolation step of oxidizing or removing the semiconductor fragments formed on surfaces of said side walls in said semiconductor thin film growing step for electrically isolating said gate electrode from said source region and said drain region.

2. The method of fabricating a semiconductor device in accordance with claim 1, wherein said semiconductor thin film growing step grows said semiconductor thin films through solid-phase epitaxy or vapor-phase selective growth or vapor-phase selective epitaxy.

3. The method of fabricating a semiconductor device in accordance with claim 1, wherein said isolation step includes an oxidation step of exposing surfaces of said semiconductor thin films to an atmosphere containing oxygen.

4. The method of fabricating a semiconductor device in accordance with claim 3, further including a removal step of dipping said semiconductor thin films in a solution containing hydrofluoric acid or exposing the same to gas containing hydrofluoric acid after said isolation step.

5. The method of fabricating a semiconductor device in accordance with claim 1, wherein said isolation step includes a first oxidation step of introducing ions containing oxygen into surfaces of said semiconductor thin films for oxidizing said surfaces of said semiconductor thin films.

6. The method of fabricating a semiconductor device in accordance with claim 5, further including a second oxidation step of heat-treating said semiconductor substrate including said semiconductor thin films for further oxidizing said surfaces of said semiconductor thin films after said first oxidation step.

7. The method of fabricating a semiconductor device in accordance with claim 5, further including a removal step of dipping said semiconductor thin films in a solution containing hydrofluoric acid or exposing the same to gas containing hydrofluoric acid after said isolation step.

8. The method of fabricating a semiconductor device in accordance with claim 1, wherein said isolation step includes a removal step of dipping said semiconductor thin films in a solution containing acid or exposing the same to gas containing acid.

9. The method of fabricating a semiconductor device in accordance with claim 8, wherein a mixed solution containing hydrofluoric acid and nitric acid is employed for said removal step of dipping said semiconductor thin films in said solution containing acid or exposing the same to said gas containing acid.

10. The method of fabricating a semiconductor device in accordance with claim 8, wherein a chemical solution having an etching rate varied with the plane orientation of said surface of said semiconductor substrate is employed for said removal step of dipping said semiconductor thin films in said solution containing acid or exposing the same to said gas containing acid.

11. The method of fabricating a semiconductor device in accordance with claim 10, wherein the plane orientation of said surface of said semiconductor substrate is along the (111) plane, and said removal step is carried out by dipping said semiconductor thin films in a solution of potassium hydroxide.

12. The method of fabricating a semiconductor device in accordance with claim 1, wherein said isolation step includes a removal step of exposing said semiconductor thin films to a plasma in a mixed gas atmosphere of gas containing at least one element selected from a group consisting of fluorine, chlorine, bromine, iodine and astatine and oxygen gas.

13. The method of fabricating a semiconductor device in accordance with claim 1, wherein said isolation step includes a removal step having steps of:

forming a metal film on surfaces of said semiconductor thin films, and heat-treating said semiconductor substrate including said metal film.

14. The method of fabricating a semiconductor device in accordance with claim 13, wherein said isolation step further includes an etching step with a mixed solution of sulfuric acid and hydrogen peroxide.

15. The method of fabricating a semiconductor device in accordance with claim 13, wherein a film of any of titanium, cobalt, zirconium and hafnium is formed in said step of forming a metal film.

16. The method of fabricating a semiconductor device in accordance with claim 1, wherein said isolation step includes a removal step of polishing surfaces of said semiconductor thin films.

17. The method of fabricating a semiconductor device in accordance with claim 1, wherein said isolation step includes a removal step of irradiating surfaces of said semiconductor thin films with a fine liquid or particulates at a high speed.

18. The method of fabricating a semiconductor device in accordance with claim 1, wherein said isolation step includes a removal step of irradiating surfaces of said semiconductor thin films with ultrasonic waves while dipping or sprinkling said semiconductor thin films in or with a liquid.

19. The method of fabricating a semiconductor device in accordance with claim 1, wherein said isolation step includes a removal step of exposing surfaces of said semiconductor thin films to halogen gas containing any of fluorine, chlorine, bromine, iodine and astatine.

20. The method of fabricating a semiconductor device in accordance with claim 1, comprising forming silicon nitride films on the side surfaces of said gate electrode.

* * * * *